(12) United States Patent
Yun et al.

(10) Patent No.: US 11,822,744 B2
(45) Date of Patent: Nov. 21, 2023

(54) DISPLAY DEVICE

(71) Applicant: Samsung Display Co., LTD., Yongin-si (KR)

(72) Inventors: Ga Yeon Yun, Seoul (KR); Bong Il Kang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 17/571,505

(22) Filed: Jan. 9, 2022

(65) Prior Publication Data

US 2022/0317803 A1 Oct. 6, 2022

(30) Foreign Application Priority Data

Mar. 30, 2021 (KR) .................. 10-2021-0041295

(51) Int. Cl.
*G06F 3/041* (2006.01)
*G06F 3/044* (2006.01)
*H10K 59/40* (2023.01)
*H10K 59/122* (2023.01)
*H10K 59/131* (2023.01)

(52) U.S. Cl.
CPC .......... *G06F 3/0418* (2013.01); *G06F 3/0446* (2019.05); *H10K 59/122* (2023.02); *H10K 59/131* (2023.02); *H10K 59/40* (2023.02)

(58) Field of Classification Search
CPC .. G06F 3/0418; G06F 3/0446; G06F 3/04164; G06F 3/04182; G06F 2203/04103; G06F 2203/04111; G06F 2203/04112; G06F 3/0412; G06F 3/0443; G06F 2203/04107; H10K 59/122; H10K 59/131; H10K 59/40; H10K 50/844; H01L 22/34; H01L 27/124
See application file for complete search history.

(56) References Cited

U.S. PATENT DOCUMENTS

| | | | |
|---|---|---|---|
| 10,303,298 B2 | 5/2019 | Hashiguchi | |
| 2016/0378265 A1* | 12/2016 | Katsurahira | .......... G06F 3/0442 345/174 |
| 2017/0131842 A1* | 5/2017 | Hashiguchi | ......... G02F 1/13338 |
| 2019/0332212 A1* | 10/2019 | Kim | ...................... G06F 3/0412 |
| 2022/0291814 A1* | 9/2022 | Nakamura | .......... G06F 3/04182 |

FOREIGN PATENT DOCUMENTS

| | | |
|---|---|---|
| JP | 6545083 | 7/2019 |
| KR | 1999-0052610 | 7/1999 |

* cited by examiner

*Primary Examiner* — Adam R. Giesy
(74) *Attorney, Agent, or Firm* — H.C. Park & Associates, PLC

(57) ABSTRACT

A display device including a display panel, and a touch member disposed on the display panel. The touch member includes a first sensing electrode extending in a first direction, a second sensing electrode extending in a second direction crossing the first direction, a first touch signal wire electrically connected to the first sensing electrode, a second touch signal wire electrically connected to the second sensing electrode, and a first noise detection wire electrically insulated from the first sensing electrode, the second sensing electrode, the first touch signal wire, and the second touch signal wire.

18 Claims, 17 Drawing Sheets

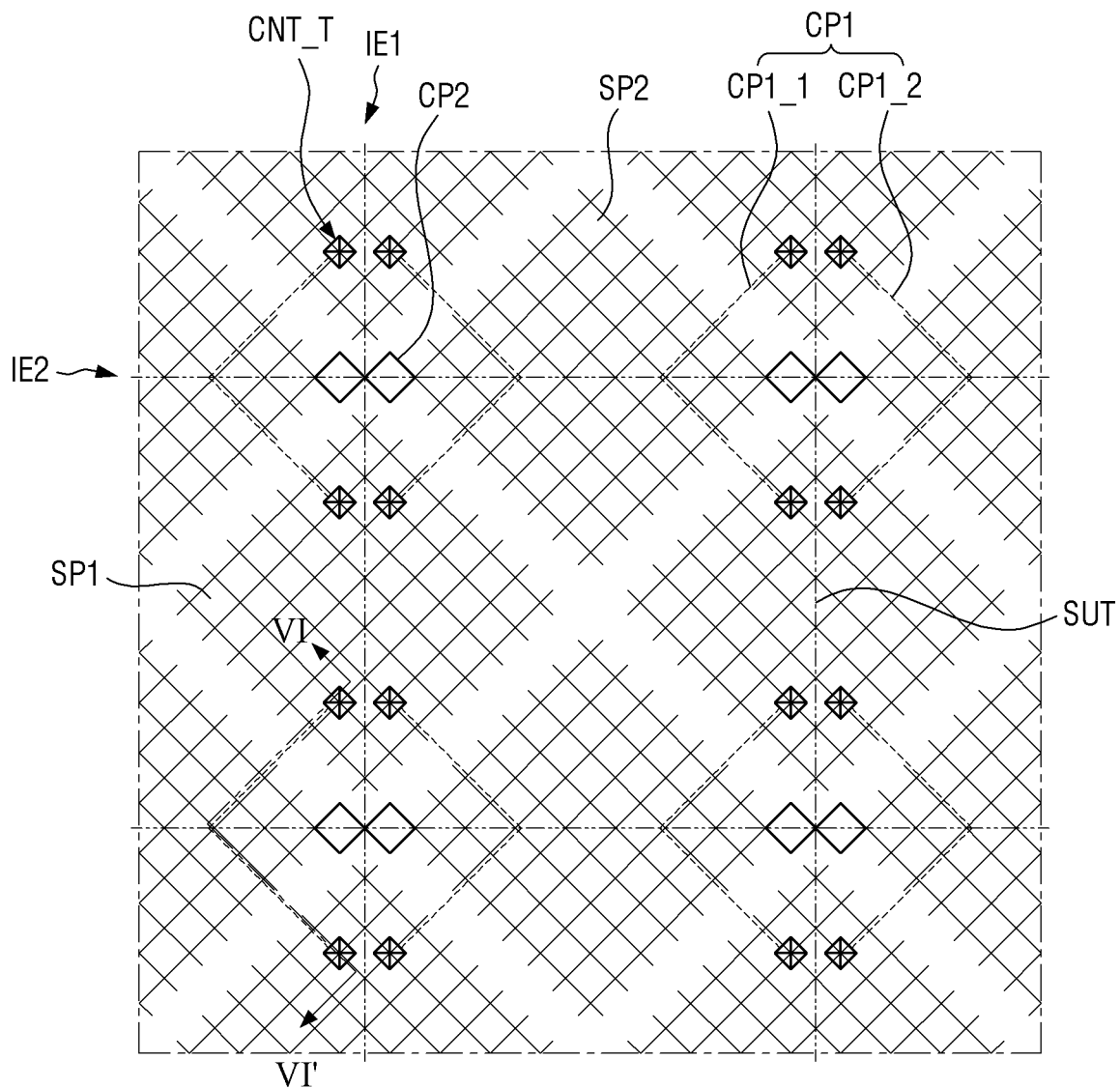
FIG. 5
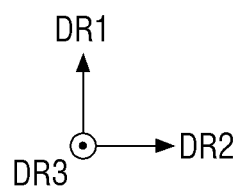

EMA: EMA_B, EMA_R, EMA_G

DISPLAY DEVICE

CROSS REFERENCE TO RELATED APPLICATION

This application claims priority from and the benefit of Korean Patent Application No. 10-2021-0041295, filed on Mar. 30, 2021, which is hereby incorporated by reference for all purposes as if fully set forth herein.

BACKGROUND

Field

Embodiments of the invention relate generally to a display device.

Discussion of the Background

With the advance of information-oriented society, more and more demands are placed on display devices for displaying images in various ways. For example, display devices are employed in various electronic devices, such as smartphones, digital cameras, laptop computers, navigation devices, and smart televisions.

As a display device, various types of display devices, such as a liquid crystal display (LCD) device, an organic light emitting display (OLED) device, and the like, have been used. Among the display devices, the organic light emitting display device displays an image using an organic light emitting element that generates light by recombination of electrons and holes. The organic light emitting display device includes a plurality of transistors that provide a driving current to the organic light emitting element, and the organic light emitting element includes an anode electrode, an organic light emitting layer, and a cathode electrode.

The display device includes a display panel for generating and displaying an image and various input devices. Recently, a touch panel which recognizes a touch input has been widely applied to a display device mainly in a smart phone or tablet PC. The touch panel determines whether an input is made, and calculates the corresponding position as touch input coordinates.

The above information disclosed in this Background section is only for understanding of the background of the inventive concepts, and, therefore, it may contain information that does not constitute prior art.

SUMMARY

Embodiments of the present invention provide a touch panel capable of detecting noise caused by poor deposition of a cathode electrode, and a display device including the same.

An embodiment of the display device also provides a touch panel capable of detecting noise, so that it is possible to detect a cathode deposition defect and noise caused by the cathode deposition defect.

Additional features of the inventive concepts will be set forth in the description which follows, and in part will be apparent from the description, or may be learned by practice of the inventive concepts.

An embodiment of the present invention provides a display device including a display panel, and a touch member disposed on the display panel. The touch member includes a first sensing electrode extending in a first direction, a second sensing electrode extending in a second direction crossing the first direction, a first touch signal wire electrically connected to the first sensing electrode, a second touch signal wire electrically connected to the second sensing electrode, and a first noise detection wire electrically insulated from the first sensing electrode, the second sensing electrode, the first touch signal wire, and the second touch signal wire.

The first noise detection wire may be arranged at an outer side of the second touch signal wire.

The display device may further include a touch ground wire arranged at an outer side of the second touch signal wire. The first noise detection wire may be arranged between the second touch signal wire and the touch ground wire.

The display device may further include a touch antistatic wire arranged at an outer side of the second touch signal wire. The first noise detection wire may be arranged between the second touch signal wire and the touch antistatic wire.

The first sensing electrode may be a driving electrode, the second sensing electrode may be a sensing electrode, the first touch signal wire may be a touch driving wire, and the second touch signal wire may be a touch sensing wire.

The display device may further include a touch area where a touch input is detected and a non-touch area disposed around the touch area. The first sensing electrode and the second sensing electrode may be disposed in the touch area, and the first touch signal wire, the second touch signal wire, and the first noise detection wire may be disposed in the non-touch area.

The display device may further include a touch pad portion connected to the first noise detection wire, and a noise detection member connected to the touch pad portion.

The display device may further include a driving chip including the noise detection member.

The first noise detection wire may be formed of the same conductive layer as at least one of the first touch signal wire or the second touch signal wire.

The display device may further include a second noise detection wire arranged at an outer side of the first touch signal wire. The first noise detection wire and the second noise detection wire may be electrically insulated from each other.

The first noise detection wire may have a closed loop shape, and the first touch signal wire and the second touch signal wire may be arranged at an inner side of the first noise detection wire.

The display device may further include a touch area where a touch input is detected and a non-touch area disposed around the touch area. The first touch signal wire, the second touch signal wire, and the first noise detection wire may be disposed in the non-touch area, and the first noise detection wire may extend to bypass the touch area.

Another embodiment of the present invention provides a display device including a substrate, an anode electrode disposed on the substrate, a pixel defining layer disposed on the anode electrode to expose the anode electrode, a light emitting layer disposed on the anode electrode exposed by the pixel defining layer, a cathode electrode disposed on the light emitting layer and the pixel defining layer, an encapsulation layer disposed on the cathode electrode, and a touch conductive layer disposed on the encapsulation layer and including a first touch signal wire, a second touch signal wire, and a noise detection wire electrically insulated from the first touch signal wire and the second touch signal wire.

The touch conductive layer may further include a first sensing electrode extending in a first direction and electrically connected to the first touch signal wire, and a second sensing electrode extending in a second direction crossing the first direction and electrically connected to the second touch signal wire, and the noise detection wire may be electrically insulated from the first sensing electrode and the second sensing electrode.

The first sensing electrode may be a driving electrode, the second sensing electrode may be a sensing electrode, the first touch signal wire may be a touch driving wire, and the second touch signal wire may be a touch sensing wire.

The noise detection wire may be arranged at an outer side of the second touch signal wire.

The display device may further include a touch ground wire arranged at an outer side of the second touch signal wire with the noise detection wire interposed therebetween.

The display device may further include a touch area where a touch input is detected and a non-touch area disposed around the touch area. The first sensing electrode and the second sensing electrode may be disposed in the touch area, and the first touch signal wire, the second touch signal wire, and the first noise detection wire may be disposed in the non-touch area.

The display device may further include a touch pad portion connected to the noise detection wire, and a noise detection member may be connected to the touch pad portion.

Another embodiment of the present invention provides a display device including an active region capable of displaying a screen and detecting a touch input and a non-active region disposed outside the active region, the display device including a display panel including a scan driving line disposed in the non-active region, and a touch member including a first touch signal wire, a second touch signal wire, and a noise detection wire electrically insulated from the first touch signal wire and the second touch signal wire, disposed in the non-active region disposed on the display panel. The noise detection wire overlaps the scan driving line.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 5 is a partially enlarged view of a touch area of FIG. 4.

DETAILED DESCRIPTION

Figure 1:
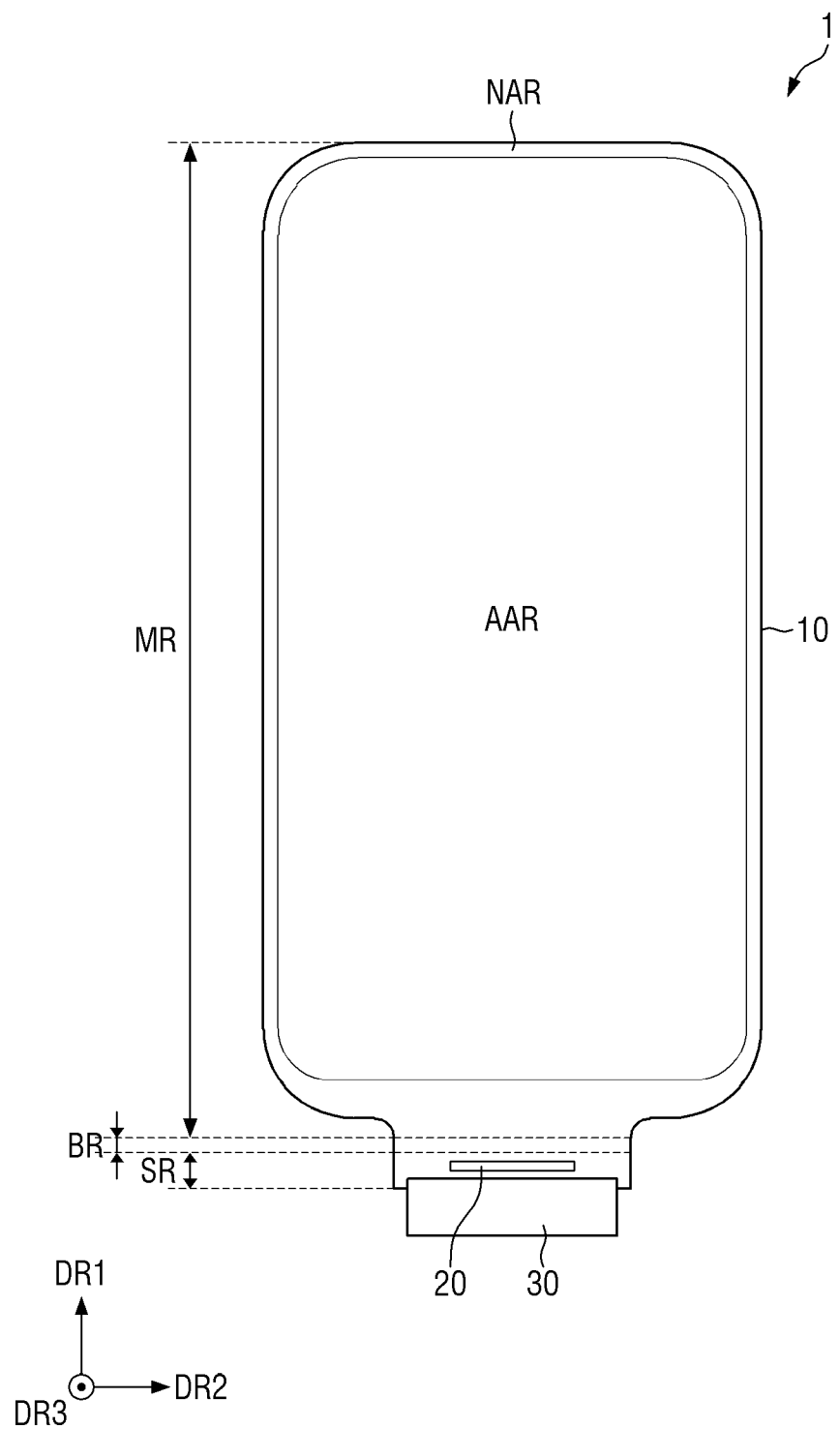
FIG. 1 is a plan view of a display device according to one embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described in detail with reference to the accompanying drawings.

Figure 2:
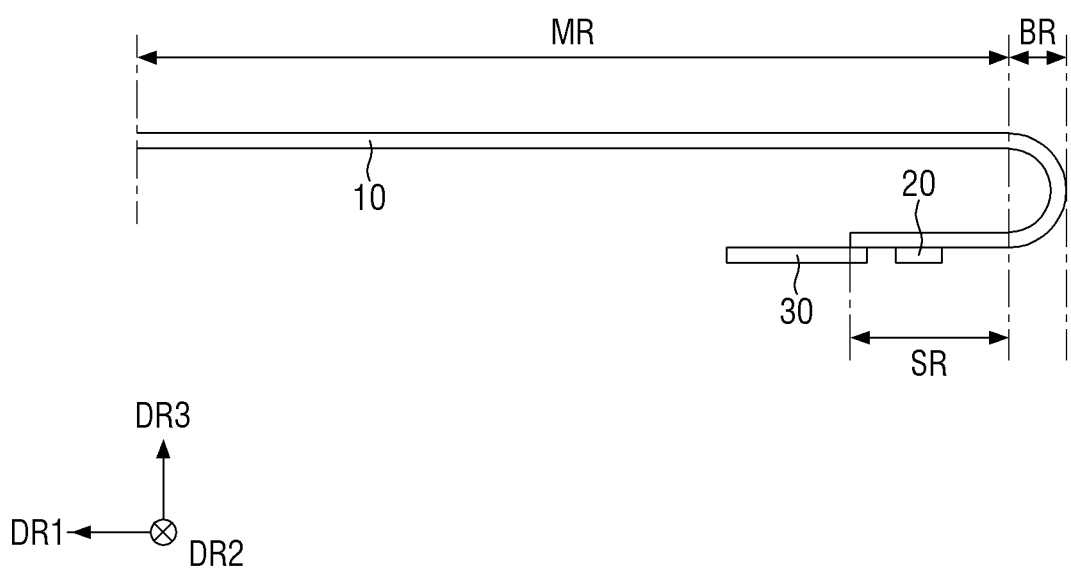
FIG. 2 is a partial schematic cross-sectional view of a display device according to one embodiment.

FIG. 1 is a plan view of a display device according to one embodiment. FIG. 2 is a partial schematic cross-sectional view of a display device according to one embodiment.

In the embodiments to be described below, a first direction DR1 and a second direction DR2 cross each other in different directions. In the plan view of FIG. 1, the vertical direction is defined as the first direction DR1 and the horizontal direction is defined as the second direction DR2 for simplicity of explanation. In the following embodiments, one side of the first direction DR1 represents an upward direction in a plan view, and the other side of the first direction DR1 represents a downward direction in a plan view. One side of the second direction DR2 represents a rightward direction in a plan view, and the other side of the second direction DR2 represents a leftward direction in a plan view.

A third direction DR3 is a direction intersecting the plane on which the first direction DR1 and the second direction DR2 are located and perpendicularly intersects both the first direction DR1 and the second direction DR2. It should be understood, however, that a direction mentioned in the embodiment refers to a relative direction and the inventive concepts are not limited to the direction mentioned.

Unless otherwise defined, with respect to the third direction DR3, the terms "above," and "top surface" as used herein refer to a display surface's side of a display panel 10, and the terms "below," and "bottom surface" as used herein refer to a side opposite to the display surface of the display panel 10.

Referring to FIGS. 1 and 2, a display device 1 may refer to any electronic device providing a display screen. Examples of the display device 1 may include a television, a laptop computer, a monitor, a billboard, an Internet-of-Things device, and the like, as well as portable electronic devices, such as a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine, a digital camera, which provide a display screen.

The display device 1 includes an active region AAR and a non-active region NAR. In the display device 1, on the assumption that an area where a screen is displayed is defined as a display area, an area where a screen is not displayed is defined as a non-display area, and an area where a touch input is detected is defined as a touch area, the display area and the touch area may be included in the active region AAR. The display area and the touch area may overlap each other. In other words, the active region AAR may be a region where the screen is displayed and the touch input is detected.

The active region AAR may have a rectangular shape or a rectangular shape with rounded corners. The illustrated active region AAR has a rectangular shape with rounded corners in which a side in the first direction DR1 is longer than a side in the second direction DR2. However, the inventive concepts are not limited thereto, and the active region AAR may have various shapes, such as a rectangle in which a side in the second direction DR2 is longer than a side in the first direction DR1, a square, other polygons, a circle, and an oval.

The non-active region NAR is disposed around the active region AAR. The non-active region NAR may be a bezel area. The non-active region NAR may surround all sides (four sides in the drawing) of the active region AAR. However, the inventive concepts are not limited thereto, and for example, the non-active region NAR may not be disposed near the upper side or near the left and right sides of the active region AAR.

In the non-active region NAR, signal wires or driving circuits for applying a signal to the active region AAR (display area or touch area) may be disposed. The non-active region NAR may not include the display area. Furthermore, the non-active region NAR may not include the touch area. In another embodiment, the non-active region NAR may include a portion of the touch area, and a sensor member such as a pressure sensor or the like may be disposed in that region. In some embodiments, the active region AAR may completely coincide with the display area where the screen is displayed, and the non-active region NAR may completely coincide with the non-display area where the screen is not displayed.

The display device 1 includes a display panel 10 which provides a display screen. Examples of the display panel 10 may include an organic light emitting display panel, a micro LED display panel, a nano LED display panel, a quantum dot light emitting display panel, a liquid crystal display panel, a plasma display panel, a field emission display panel, an electrophoretic display panel, an electrowetting display panel, and the like. In the following description, a case where an organic light emitting display panel is applied as an example of the display panel 10 will be exemplified, but the inventive concepts are not limited thereto, and other display panels may be applied within the same scope of technical spirit.

The display panel 10 may include a plurality of pixels. The plurality of pixels may be arranged in a matrix. The shape of each pixel may be a rectangular or square shape in a plan view. However, the inventive concepts are not limited thereto, and the shape of each pixel may be a rhombic shape in which each side is inclined with respect to the first direction DR1 or the second direction DR2. Each pixel may include an emission area. Each emission area may be the same as or different from the shape of the pixel. For example, when the shape of the pixel is a rectangular shape, the emission area of the corresponding pixel may have various shapes such as a rectangle, a rhombus, a hexagon, an octagon, and a circle. A detailed description of each pixel and the emission area will be made later.

The display device 1 may further include a touch member for detecting a touch input. The touch member may be provided in the form of a touch layer TSL (see FIG. 8) on the display panel 10. In this case, the touch layer TSL (see FIG. 8) may be provided integrally with the display panel 10. However, the inventive concepts are not limited thereto, and the touch member may be provided as a separate panel or film from the display panel 10 and may be attached to the display panel 10. In the following embodiment, a case where the touch member is provided in the form of the touch layer TSL (see FIG. 8) is exemplified, but the inventive concepts are not limited thereto.

The display panel 10 may include a flexible substrate including a flexible polymer material such as polyimide. Accordingly, the display panel 10 can be curved, bent, folded or rolled.

The display panel 10 may include a bending region BR, which is a region in which the panel is bent. The display panel 10 may be divided into a main region MR located at one side of the bending region BR in the first direction DR1 and a sub-region SR located at the other side of the bending region BR in the first direction DR1.

The display area of the display panel 10 is disposed in the main region MR. In one embodiment, a peripheral edge portion of the display area in the main region MR, the entire bending region BR, and the entire sub-region SR may be the non-display area. However, the inventive concepts are not limited thereto, and the bending region BR and/or the sub-region SR may also include the display area.

The main region MR may have a shape substantially similar to an outer shape of the display device 1 in a plan view. The main region MR may be a flat region located on one plane. However, the inventive concepts are not limited thereto, and at least one edge of the remaining edges except an edge (side) of the main region MR connected to the bending region BR may be bent in a curved shape or bent in a vertical direction.

If at least one of the edges other than the edge of the main region MR connected to the bending region BR is curved or bent, the display area may also be disposed on the corresponding edge. However, the inventive concepts are not limited thereto, and the non-display area that does not display a screen may be disposed on the curved or bent edge. Alternatively, both the display area and the non-display area may be disposed thereon.

The bending region BR is connected to the other side of the main region MR in the first direction DR1. For example, the bending region BR may be connected to the main region MR through a lower short side of the main region MR. The width of the bending region BR may be smaller than the width (width of the short side) of the main region MR. A connection portion between the main region MR and the bending region BR may have an L-shaped cut portion.

In the bending region BR, the display panel 10 may be bent with a curvature downward in a thickness direction, i.e., a direction opposite to a display surface. The bending region BR may have a constant radius of curvature. However, the inventive concepts are not limited thereto, and the bending region BR may have a different radius of curvature for each section. The surface of the display panel 10 may be reversed as the display panel 10 is bent in the bending region BR. In other words, one surface of the display panel 10 facing upward may be changed to face outward through the bending region BR and then to face downward.

The sub-region SR extends from the bending region BR. The sub-region SR may extend in a direction parallel to the main region MR from a point where bending is completed. The sub-region SR may overlap the main region MR in the thickness direction of the display panel 10. The width of the sub-region SR (width in the second direction DR2) may be the same as the width of the bending region BR, but the inventive concepts are not limited thereto.

A driving chip 20 may be disposed in the sub-region SR. The driving chip 20 may include an integrated circuit for driving the display panel 10. The integrated circuit may include a display integrated circuit and/or a touch unit integrated circuit. However, the inventive concepts are not limited thereto, and the display integrated circuit and the touch unit integrated circuit may be provided as separate chips or may be provided as one integrated chip.

A pad portion may be disposed at an end portion of the sub-region SR of the display panel 10. The pad portion may include a plurality of display signal wiring pads and touch signal wiring pads. A driving substrate 30 may be connected to the pad portion of the end portion of the sub-region SR of the display panel 10. The driving substrate 30 may be a flexible printed circuit board or film.

Figure 3:
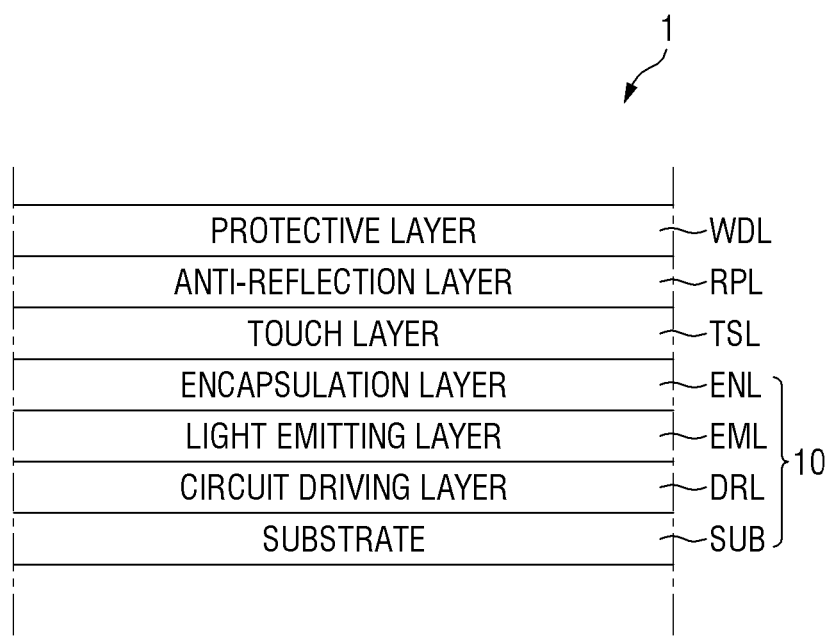
FIG. 3 is a schematic cross-sectional view illustrating a stacked structure of a display panel according to one embodiment.

FIG. 3 is a schematic cross-sectional view illustrating a stacked structure of a display panel according to one embodiment.

Referring to FIG. 3, the display device 1 may include a substrate SUB, a circuit driving layer DRL, a light emitting layer EML, an encapsulation layer ENL, a touch layer TSL, an anti-reflection layer RPL, and a protective layer WDL, which are sequentially stacked. The display panel 10 may include the substrate SUB, the circuit driving layer DRL, the light emitting layer EML, and the encapsulation layer ENL.

The substrate SUB may support components disposed thereon.

The circuit driving layer DRL may be disposed on the substrate SUB. The circuit driving layer DRL may include a circuit that drives the light emitting layer EML of the pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with various luminance levels according to a driving signal transmitted from the circuit driving layer DRL.

The encapsulation layer ENL may be disposed on the light emitting layer EML. The encapsulation layer ENL may include an inorganic layer or a laminated layer of an inorganic layer and an organic layer. As another example, the encapsulation layer ENL may be implemented with a glass or an encapsulation film.

The touch layer TSL may be disposed on the encapsulation layer ENL. The touch layer TSL is a layer for recognizing a touch input, and may function as a touch member. The touch layer TSL may include a plurality of sensing areas and sensing electrodes.

The anti-reflection layer RPL may be disposed on the touch layer TSL. The anti-reflection layer RPL may serve to reduce reflection of external light. The anti-reflection layer RPL may be attached in the form of a polarizing film. In this case, the anti-reflection layer RPL may polarize light passing therethrough, and may be attached onto the touch layer TSL through an adhesive layer. The anti-reflection layer RPL in the form of a polarizing film may be omitted. The anti-reflection layer RPL may serve to reduce reflection of external light.

However, without being limited thereto, the anti-reflection layer RPL may be stacked in the form of a color filter layer inside the display panel 10. In this case, the anti-reflection layer RPL may include a color filter or the like for selectively transmitting light of a specific wavelength.

The protective layer WDL may be disposed on the anti-reflection layer RPL. The protective layer WDL may include, for example, a window member. The protective layer WDL may be attached onto the anti-reflection layer RPL by an optically transparent adhesive or the like.

A detailed stacked structure of the display panel 10 will be described later.

Figure 4:
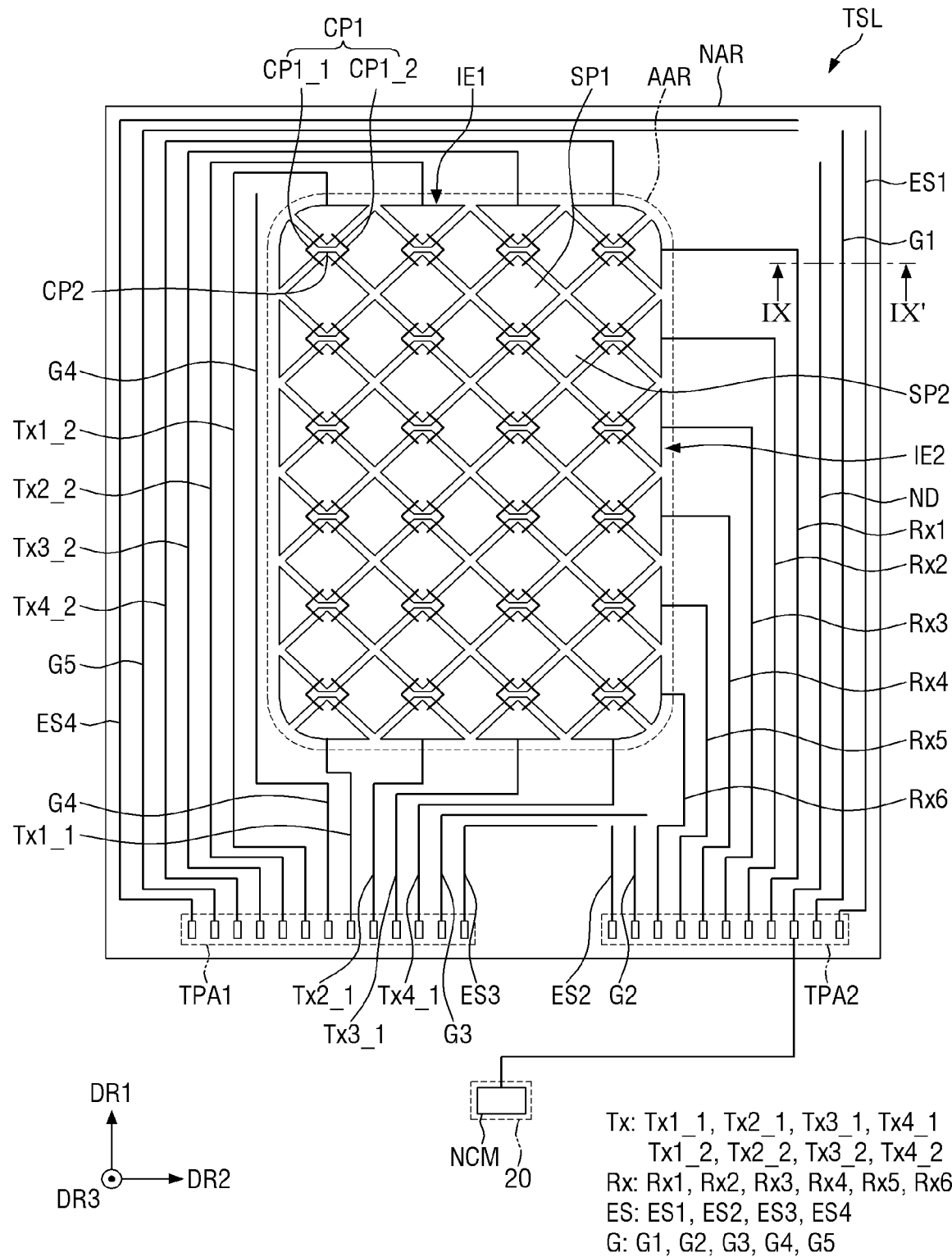
FIG. 4 is a schematic plan layout view of a touch member according to one embodiment.
Figure 6:
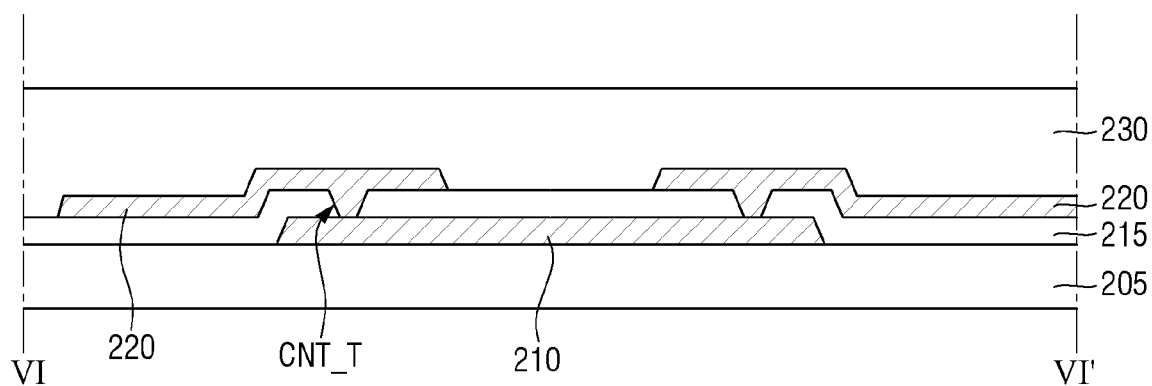
FIG. 6 is a cross-sectional view taken along line VI-VI' of FIG. 5.

FIG. 4 is a schematic plan layout view of a touch member according to one embodiment. FIG. 5 is a partially enlarged view of a touch area of FIG. 4. FIG. 6 is a cross-sectional view taken along line VI-VI' of FIG. 5.

Referring to FIGS. 4 to 6, the touch member may include a touch area positioned in the active region AAR and a non-touch area positioned in the non-active region NAR. In FIG. 4, for simplicity of description, the overall shape of the touch member is simplified and the non-touch area is illustrated as being relatively wide. However, the shape of the touch area and the shape of the non-touch area may be substantially the same as the above-described shapes of the active region AAR and the non-active region NAR.

The touch member may include a plurality of first sensing electrodes IE1 (or first touch electrodes) and a plurality of second sensing electrodes IE2 (or second touch electrodes) disposed in the touch area. One of the first sensing electrode IE1 and the second sensing electrode IE2 may be a driving electrode, and the other may be a sensing electrode. In this embodiment, a case is exemplified in which the first sensing electrode IE1 is a driving electrode and the second sensing electrode IE2 is a sensing electrode.

The first sensing electrode IE1 may extend in the first direction DR1. The first sensing electrode IE1 may include a plurality of first sensor portions SP1 arranged along the first direction DR1 and a first connection portion CP1 electrically connecting the adjacent first sensor portions SP1 to each other. The plurality of first sensing electrodes IE1 may be arranged in the second direction DR2.

The second sensing electrode IE2 may extend in the second direction DR2. The second sensing electrode IE2 may include a plurality of second sensor portions SP2 arranged in the second direction DR2 and a second connection portion CP2 electrically connecting the adjacent second sensor portions SP2 to each other. The plurality of second sensing electrodes IE2 may be arranged in the first direction DR1.

Although the drawing illustrates a case where four first sensing electrodes IE1 and six second sensing electrodes IE2 are arranged, it is obvious that the number of the first sensing electrodes IE1 and the number of the second sensing electrodes IE2 are not limited to the above example.

At least some of the first sensor portions SP1 and the second sensor portions SP2 may have a rhombic shape. Some of the first sensor portions SP1 and the second sensor portions SP2 may have a shape of a figure cut from a rhombus. For example, all of the first sensor portions SP1 and the second sensor portions SP2 except for the sensor portions at both ends in their extension direction may have a rhombic shape, and each of the first sensor portions SP1 and the second sensor portions SP2 positioned at both ends in their extension direction may have a triangular shape obtained by cutting a rhombus in half. The rhombic first sensor portions SP1 and the rhombic second sensor portions SP2 may have substantially the same size and shape. The triangular first sensor portions SP1 and the triangular second sensor portions SP2 may have substantially the same size and shape. However, the inventive concepts are not limited to the above example, and the shapes and sizes of the first sensor portion SP1 and the second sensor portion SP2 may be variously modified.

Figure 7:
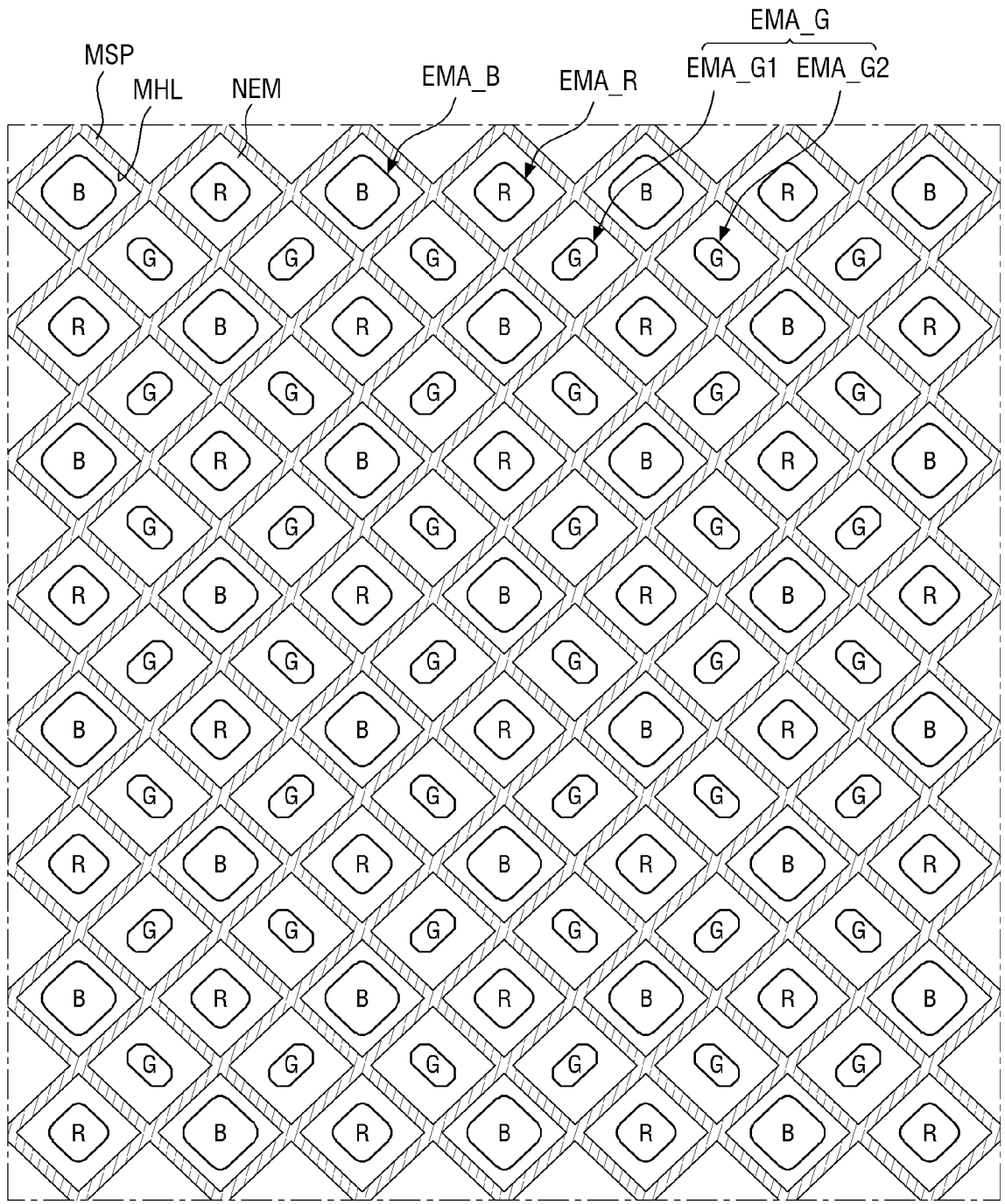
FIG. 7 is a layout view illustrating a relative arrangement relationship between pixels of a display unit and a mesh pattern of a touch member according to one embodiment.
Figure 7:
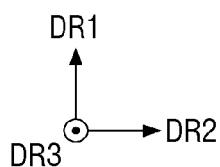

The first sensor portion SP1 of the first sensing electrode IE1 and the second sensor portion SP2 of the second sensing electrode IE2 may each include a planar pattern or a mesh pattern. When the first sensor portion SP1 and the second sensor portion SP2 include a planar pattern, the first sensor portion SP1 and the second sensor portion SP2 may be formed of a transparent conductive layer. When the first sensor portion SP1 and the second sensor portion SP2 include a mesh pattern disposed along a non-emission area as illustrated in FIGS. 5 and 7, even if an opaque low-resistance metal is applied, they may not interfere with the travel of the emitted light. Hereinafter, a case where the first sensor portion SP1 and the second sensor portion SP2 each includes a mesh pattern will be described as an example, but the inventive concepts are not limited thereto.

The first connection portion CP1 may connect the corner portions of the adjacent rhombic or triangular first sensor portions SP1 to each other. The second connection portion CP2 may connect the corner portions of the adjacent rhombic or triangular second sensor portions SP2 to each other.

The first sensing electrode IE1 and the second sensing electrode IE2 may intersect each other while being insulated. Insulation between the first sensing electrode IE1 and the second sensing electrode IE2 may be ensured by being connected through conductive layers positioned on different layers in the intersecting region. Insulation and intersection between the first sensing electrode IE1 and the second sensing electrode IE2 may be achieved by the first connection portion CP1 and/or the second connection portion CP2. For the insulation and intersection, at least one of the first connection portion CP1 or the second connection portion CP2 may be positioned on a different layer from the first sensing electrode IE1 and the second sensing electrode IE2.

As one example, the first sensor portion SP1 of the first sensing electrode IE1 and the second sensor portion SP2 of the second sensing electrode IE2 are formed of a conductive layer positioned on the same layer, and the first sensor portion SP1 and the second sensor portion SP2 themselves may not intersect or overlap each other. The first sensor portion SP1 and the second sensor portion SP2 adjacent to each other may be physically spaced apart from each other.

The second connection portion CP2 may be formed of the same conductive layer as that of the second sensor portion SP2 to connect the adjacent second sensor portions SP2. The adjacent first sensor portions SP1 of the first sensing electrode IE1 are physically spaced apart from each other with respect to a region through which the second connection portion CP2 passes. The first connection portion CP1 that connects the first sensor portions SP1 may be formed of a conductive layer different from that of the first sensor portion SP1 and may cross the area of the second sensing electrode IE2. The first connection portion CP1 may be electrically connected to each first sensor portion SP1 adjacent thereto through a contact.

A plurality of first connection portions CP1 may be provided. For example, although not limited to the following, the first connection portion CP1 may include one first connection portion CP1_1 passing by the second sensing electrode IE2 on one side adjacent thereto while overlapping it, and another first connection portion CP1_2 passing by the second sensing electrode IE2 on the other side adjacent thereto while overlapping it. When a plurality of first connection portions CP1 connecting two adjacent first sensor portions SP1 are provided, even if any one of them is disconnected due to static electricity or the like, the corresponding first sensing electrode IE1 may be prevented from being disconnected.

The first sensor portions SP1 and the second sensor portions SP2 adjacent to each other may constitute a unit sensing area SUT (see FIG. 5). For example, half of two adjacent first sensor portions SP1 and half of two adjacent second sensor portions SP2 with respect to a region where the first sensing electrode IE1 and the second sensing electrode IE2 intersect may constitute a single square or rectangle. As described above, an area defined by the half areas of the two adjacent first and second sensor portions SP1 and SP2 may be one unit sensing area SUT. A plurality of unit sensing areas SUT may be arranged in a matrix.

In each unit sensing area SUT, by detecting a change in capacitance between the first sensor portions SP1 and the second sensor portions SP2 adjacent to each other, it is determined whether a touch input is made, and the corresponding position may be calculated as touch input coordinates. The touch sensing may be performed in a mutual cap method, but is not limited thereto.

Each unit sensing area SUT may be larger in size than a pixel. For example, the unit sensing area SUT may correspond to a plurality of pixels. The length of one side of the unit sensing area SUT may be in the range of 4 to 5 mm, but is not limited thereto.

A plurality of touch signal wires are disposed in the non-active region NAR outside the touch area. The touch signal wires may extend from touch pad portions TPA1 and TPA2. The touch pad portions TPA1 and TPA2 may be located in the sub-region SR (see FIG. 1). That is, the touch signal wires may extend from the touch pad portions TPA1 and TPA2 positioned in the sub-region SR (see FIG. 1) to the non-active region NAR of the main region MR (see FIG. 1) through the bending region BR (see FIG. 1).

The touch member may further include a plurality of touch signal wires disposed in the non-touch area. The plurality of touch signal wires may include a plurality of touch driving wires Tx and a plurality of touch sensing wires Rx. In one embodiment, the plurality of touch signal wires may further include a touch ground wire G and/or a touch antistatic wire ES.

The touch driving wire Tx is connected to the first sensing electrode IE1. In one embodiment, the plurality of touch driving wires may be connected to one first sensing electrode IE1. For example, the touch driving wire may include first touch driving wires $Tx1\_1$, $Tx2\_1$, $Tx3\_1$, and $Tx4\_1$ connected to the lower end of the first sensing electrode IE1, and second touch driving wires $Tx1\_2$, $Tx2\_2$, $Tx3\_2$, and $Tx4\_2$ connected to the upper end of the first sensing electrode IE1. The first touch driving wires $Tx11\_$, $Tx2\_1$, $Tx31$, and $Tx4\_1$ may extend from the touch pad portion TPA1 to one side in the first direction DR1 to be connected to the lower end of the first sensing electrode IE1. The second touch driving wires $Tx1\_2$, $Tx2\_2$, $Tx3\_2$, and $Tx4\_2$ may extend from the touch pad portion TPA1 to one side in the first direction DR1, and bypass the left edge of the touch area to be connected to the upper end of the first sensing electrode IE1.

The touch sensing wire Rx is connected to the second sensing electrode IE2. In one embodiment, one touch sensing wire Rx may be connected to one second sensing electrode IE2. Each of the touch sensing wires Rx1, Rx2, Rx3, Rx4, Rx5, and Rx6 may extend from the touch pad portion TPA2 to one side in the first direction DR1, and extend toward the right edge side of the touch area to be connected to the right end of the second sensing electrode IE2. Each of the touch sensing wires Rx1, Rx2, Rx3, Rx4, Rx5, and Rx6 may be spaced apart from each other in the second direction DR2.

The touch antistatic wire ES may be disposed at the outermost portion of the touch signal wire. In one embodiment, the touch antistatic wire may include a first touch antistatic wire ES1, a second touch antistatic wire ES2, a third touch antistatic wire ES3, and a fourth touch antistatic wire ES4. The first to fourth touch antistatic wires ES may surround the touch area and the signal wires in a ring shape.

The first touch antistatic wire ES1 may cover the outer side of the touch signal wires positioned on the right side. The second touch antistatic wire ES2 may cover the inner side of the touch signal wires positioned on the right side. The third touch antistatic wire ES3 may cover the inner side of the touch signal wires positioned on the left side, and the outer side of the touch signal wires extending in the second direction DR2 on the lower side of the touch area. The fourth touch antistatic wire ES4 may cover the outer side of the touch signal wires positioned on the left side, and the outer side of the touch signal wires extending in the second direction DR2 on the upper side of the touch area.

The touch ground wire G may be disposed between the signal wires. The touch ground wire G may include a first touch ground wire G1, a second touch ground wire G2, a third touch ground wire G3, a fourth touch ground wire G4, and a fifth touch ground wire G5. The first touch ground wire G1 may be disposed between the touch sensing wire Rx and the first touch antistatic wire ES1. The second touch ground wire G2 may be disposed between the second touch antistatic wire ES2 and the touch sensing wire Rx. The third touch ground wire G3 may be disposed between the first touch driving wire Tx_1 and the third touch antistatic wire ES3. The fourth touch ground wire G4 may be disposed between the first touch driving wire Tx_1 and the second touch driving wire Tx_2. The fifth touch ground wire G5 may be disposed between the second touch driving wire Tx_2 and the fourth touch antistatic wire ES4.

The touch member may further include a noise detection wire ND and a noise detection member NCM disposed in the non-touch area. The noise detection wire ND may extend from the touch pad portion TPA2. The noise detection wire ND may be disposed between the touch sensing wire Rx and the first touch ground wire G1. The noise detection wire ND may be disposed between the touch sensing wire Rx and the first touch ground wire G1 and may extend in the first direction DR1 from the touch pad portion TPA2. However, the inventive concepts are not limited thereto, and the noise detection wire ND may be disposed between the first touch ground wire G1 and the first touch antistatic wire ES1.

The noise detection wire ND may be separated from the plurality of touch signal wires, and may be electrically insulated from the plurality of touch signal wires. That is, the noise detection wire ND may be electrically insulated from the touch sensing wire Rx, the touch ground wire G, and the touch antistatic wire ES. In addition, the noise detection wire ND may be separated from the first sensor portion SP1 and the second sensor portion SP2, and may be electrically insulated from the first sensor portion SP1 and the second sensor portion SP2. As the display device 1 further includes the separate noise detection wire ND insulated from the touch sensing wire Rx, a deposition defect of a cathode electrode 180 (see FIG. 10) may be smoothly detected.

The noise detection member NCM may be disposed in the driving chip 20 or formed as a portion of the driving chip 20, but is not limited thereto, and the noise detection member NCM may be provided as a separate and independent component. The noise detection member NCM may be electrically connected to the noise detection wire ND through the touch pad portion TPA2. The noise detection member NCM may detect noise by determining the presence and/or magnitude of a signal transmitted to the noise detection wire ND. Further, the noise detection member NCM may determine whether the cathode electrode 180 has been formed by detecting the noise. This will be described in detail later.

The touch member may include a base layer 205, a first touch conductive layer 210 on the base layer 205, a first touch insulating layer 215 on the first touch conductive layer 210, a second touch conductive layer 220 on the first touch insulating layer 215, and a second touch insulating layer 230 covering the second touch conductive layer 220.

Specifically, the first touch conductive layer 210 is disposed on the base layer 205. The first touch conductive layer 210 is covered with the first touch insulating layer 215. The first touch insulating layer 215 insulates the first touch conductive layer 210 from the second touch conductive layer 220. The second touch conductive layer 220 is disposed on the first touch insulating layer 215. The second touch insulating layer 230 may cover the second touch conductive layer 220 to protect it.

The base layer 205 may include an inorganic insulating material. For example, the base layer 205 may include a silicon nitride layer, a silicon oxynitride layer, a silicon oxide layer, a titanium oxide layer, an aluminum oxide layer, or the like. In some embodiments, the base layer 205 may be replaced with a second inorganic layer 193 (see FIG. 8) constituting a thin film encapsulation layer to be described later. In this case, the first touch conductive layer 210 may be disposed directly on the second inorganic layer 193 (see FIG. 8).

Each of the first touch conductive layer 210 and the second touch conductive layer 220 may include a metal or a transparent conductive layer. The metal may include aluminum, titanium, copper, molybdenum, silver, or an alloy thereof. The transparent conductive layer may include transparent conductive oxide such as indium tin oxide (ITO), indium zinc oxide (IZO), zinc oxide (ZnO), or indium tin zinc oxide (ITZO), a conductive polymer such as PEDOT, metal nanowires, graphene, or the like. As described above, when the first touch conductive layer 210 and the second touch conductive layer 220 are disposed on the non-emission area, even if they are made of a low-resistance opaque metal, they may not interfere with the travel of the emitted light.

The first touch conductive layer 210 and/or the second touch conductive layer 220 may include a conductive layer having a multilayer structure. For example, the first touch conductive layer 210 and/or the second touch conductive layer 220 may have a three-layer structure of titanium/aluminum/titanium.

In one embodiment, the above-described first connection portion CP1 may be formed of the first touch conductive layer 210, and the first sensor portion SP1, the second sensor portion SP2, and the second connection portion CP2 may be formed of the second touch conductive layer 220. However, the inventive concepts are not limited thereto. Unlike the illustrated example, the first connection portion CP1 may be formed of the second touch conductive layer 220, and the sensor portions SP1 and SP2 and the second connection portion CP2 may be formed of the first touch conductive layer 210. The touch signal wire may be formed of the first touch conductive layer 210 or the second touch conductive layer 220, or may be formed of the first touch conductive layer 210 and the second touch conductive layer 220 connected by a contact. In addition, the touch conductive layer constituting each member of the sensing electrode or the signal wire may be variously modified.

The first touch insulating layer 215 and the second touch insulating layer 230 may include an inorganic material or an organic material. In one embodiment, one of the first touch insulating layer 215 and the second touch insulating layer 230 may include an inorganic material, and the other may include an organic material. In one embodiment, the first touch insulating layer 215 may include a silicon nitride layer, a silicon oxynitride layer, a silicon oxide layer, a titanium oxide layer, an aluminum oxide layer, or the like. The second touch insulating layer 230 may include at least one of acrylic resin, methacrylic resin, polyisoprene, vinyl resin, epoxy resin, urethane resin, cellulose resin, siloxane resin, polyimide resin, polyamide resin, or perylene resin. When the second touch insulating layer 230 includes an organic material, the top surface thereof may be substantially flat despite a stepped portion therebelow.

FIG. 7 is a layout view illustrating a relative arrangement relationship between pixels of a display unit and a mesh pattern of a touch member according to one embodiment.

Referring to FIG. 7, the display area of the active region AAR includes a plurality of pixels. Each pixel includes an emission area EMA. The emission area EMA may overlap an opening of a pixel defining layer 126 (see FIG. 8) and may be defined by the opening. A non-emission area NEM is disposed between the emission areas EMA of the pixels. The non-emission area NEM may overlap the pixel defining layer 126 (see FIG. 8) and may be defined by the pixel defining layer 126. The non-emission area NEM may surround the emission area EMA. The non-emission area NEM has a grid shape or a mesh shape disposed along a diagonal direction crossing the first direction DR1 and the second direction DR2 in a plan view.

The mesh pattern MSP is disposed in the non-emission area NEM. The mesh pattern MSP may be substantially the same as at least one of the first touch conductive layer 210 or the second touch conductive layer 220 described with reference to FIGS. 4 to 6.

The pixel may include a first color pixel (e.g., red pixel), a second color pixel (e.g., blue pixel), and a third color pixel (e.g., green pixel). The shape of the emission area EMA of each color pixel may be substantially an octagon, a quadrangle with rounded corners, or a rhombus. However, the inventive concepts are not limited thereto, and the shape of each emission area EMA may be a circular shape, other polygonal shapes such as a rhombic shape, a rounded polygonal shape, or the like.

In one embodiment, the shape of an emission area EMA_R of the first color pixel and the shape of an emission area EMA_B of the second color pixel may be similar to each other in a rhombic shape with rounded corners. The emission area EMA_B of the second color pixel may be larger than the emission area EMA_R of the first color pixel.

An emission area EMA_G of the third color pixel may be smaller than the emission area EMA_R of the first color pixel. The emission area EMA_G of the third color pixel may be inclined in a diagonal direction and may have an octagonal shape having a maximum width in the inclined direction. The third color pixel may include a third color pixel in which an emission area EMA_G1 is inclined in a first diagonal direction, and a third color pixel in which an emission area EMA_G2 is inclined in a second diagonal direction.

The emission area EMA of each color pixel may be arranged in various ways. In one embodiment, the emission area EMA_R of the first color pixel and the emission area EMA_B of the second color pixel may be alternately arranged along the second direction DR2 to form a first row, and the emission area EMA_G of the third color pixel may be arranged along the second direction DR2 in a second row adjacent thereto. The emission areas EMA belonging to the second row may be alternately disposed in the second direction DR2 with respect to the emission areas EMA belonging to the first row. In the second row, the emission area EMA_G1 of the third color pixel inclined in the first diagonal direction and the emission area EMA_G2 of the third color pixel inclined in the second diagonal direction may be alternately arranged along the second direction DR2. The number of the emission areas EMA_G of the third color pixel in the second row may be twice the number of the emission areas EMA_R of the first color pixel or the number of the emission areas EMA_B of the second color pixel in the first row.

The third row has the arrangement of the same color pixels as those of the first row, but the arrangement order may be reversed. That is, the emission area EMA_B of the second color pixel may be disposed in the third row belonging to the same column as the emission area EMA_R of the first color pixel in the first row, and the emission area EMA_R of the first color pixel may be disposed in the third row belonging to the same column as the emission area EMA_B of the second color pixel in the first row. Similarly to the second row, a fourth row may have the arrangement of the emission areas EMA_G of the third color pixel, but the arrangement order may be reversed from the perspective of the diagonally inclined shape. That is, the emission area EMA_G2 of the third color pixel inclined in the second diagonal direction may be disposed in the fourth row belonging to the same column as the emission area EMA_G1 of the third color pixel inclined in the first diagonal direction in the second row, and the emission area EMA_G1 of the third color pixel inclined in the first diagonal direction may be disposed in the fourth row belonging to the same column as the emission area EMA_G2 of the third color pixel inclined in the second diagonal direction in the second row.

The arrangement of the first to fourth rows may be repeated along the first direction DR1. However, the arrangement of the pixels is not limited to the above example.

The mesh pattern MSP may be disposed along the boundary of the pixel in the non-emission area NEM. The mesh pattern MSP may not overlap the emission area EMA. The width of the mesh pattern MSP may be smaller than the width of the non-emission area NEM. In one embodiment, a mesh hole MHL exposed by the mesh pattern MSP may have a substantially rhombic shape. The size of each mesh hole MHL may be the same, but may be different depending on the size of the emission area EMA exposed by the corresponding mesh hole MHL, or may be different regardless thereof. In the drawing, a case where one mesh hole MHL corresponds to one emission area EMA is exemplified, but the inventive concepts are not limited thereto, and one mesh hole MHL may correspond to two or more emission areas EMA.

Hereinafter, a cross-sectional structure of the display device will be described.

Figure 8:
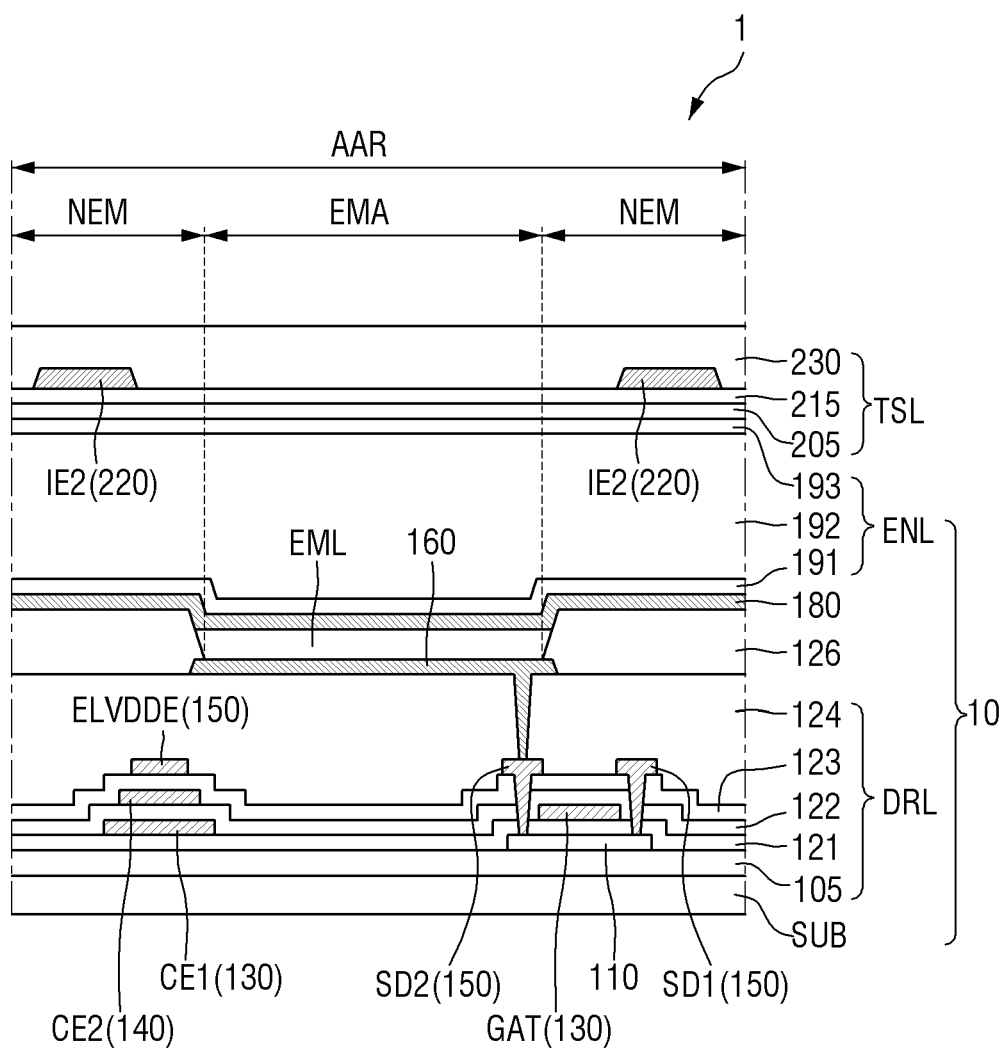
FIG. 8 is a cross-sectional view of a periphery of one pixel in a display device according to one embodiment.

FIG. 8 is a cross-sectional view of a periphery of one pixel in a display device according to one embodiment.

First, a cross-sectional view of the active region AAR will be described with reference to FIG. 8.

The display device 1 may include a substrate SUB, a buffer layer 105, a semiconductor layer 110, a first insulating layer 121, a first gate conductive layer 130, a second insulating layer 122, a second gate conductive layer 140, a third insulating layer 123, a data conductive layer 150, a fourth insulating layer 124, an anode electrode 160, the pixel defining layer 126 having an opening that exposes the anode electrode 160, the light emitting layer EML disposed in the opening of the pixel defining layer 126, the cathode electrode 180 disposed on the light emitting layer EML and the pixel defining layer 126, and the encapsulation layer ENL disposed on the cathode electrode 180. Each of the layers described above may consist of a single layer, or a stack of multiple layers. Another layer may be further disposed between the respective layers.

The circuit driving layer DRL may include the buffer layer 105, the semiconductor layer 110, the first insulating layer 121, the first gate conductive layer 130, the second insulating layer 122, the second gate conductive layer 140, the third insulating layer 123, the data conductive layer 150, and the fourth insulating layer 124.

The substrate SUB may support the respective layers disposed thereon. The substrate SUB may be made of an insulating material such as a polymer resin or an inorganic material such as glass or quartz. The substrate SUB may be a flexible substrate, and may be bent, rolled, or folded, but is not limited thereto.

The buffer layer 105 is disposed on the substrate SUB. The buffer layer 105 may include silicon nitride, silicon oxide, or silicon oxynitride.

The semiconductor layer 110 is disposed on the buffer layer 105. The semiconductor layer 110 forms a channel of a thin film transistor of a pixel.

The first insulating layer 121 is disposed on the semiconductor layer 110. The first insulating layer 121 may be a gate insulating layer having a gate insulating function.

The first gate conductive layer 130 is disposed on the first insulating layer 121. The first gate conductive layer 130 may include a gate electrode GAT of the thin film transistor of the pixel PX, a scan line connected thereto, and a first electrode CE1 of a storage capacitor.

The second insulating layer 122 may be disposed on the first gate conductive layer 130. The second insulating layer 122 may be an interlayer insulating layer or a second gate insulating layer.

The second gate conductive layer 140 is disposed on the second insulating layer 122. The second gate conductive layer 140 may include a second electrode CE2 of the storage capacitor.

The third insulating layer 123 is disposed on the second gate conductive layer 140. The third insulating layer 123 may be an interlayer insulating layer.

The data conductive layer 150 is disposed on the third insulating layer 123. The data conductive layer 150 may include a first electrode SD1 and a second electrode SD2 of the thin film transistor of the pixel, and a data line connected thereto. The first electrode SD1 and the second electrode SD2 of the thin film transistor may be electrically connected to a source region and a drain region of the semiconductor layer 110 through contact holes penetrating the third insulating layer 123, the second insulating layer 122, and the first insulating layer 121.

The fourth insulating layer 124 is disposed on the data conductive layer 150. The fourth insulating layer 124 covers the data conductive layer 150. The fourth insulating layer 124 may be a via layer. The fourth insulating layer 124 may include an organic insulating layer, and in this case, the top surface of the fourth insulating layer 124 may be substantially flat despite a stepped portion therebelow.

The anode electrode 160 is disposed on the fourth insulating layer 124. The anode electrode 160 may be a pixel electrode provided for each pixel. The anode electrode 160 may be connected to the second electrode SD2 of the thin film transistor through a contact hole penetrating the fourth insulating layer 124. The anode electrode 160 may at least partially overlap the emission area EMA.

The anode electrode 160 may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and disposed closer to the light emitting layer EML. The anode electrode 160 may have a multilayer structure such as ITO/Mg, ITO/MgF, ITO/Ag and ITO/Ag/ITO, but is not limited thereto.

The pixel defining layer 126 may be disposed on the anode electrode 160. The pixel defining layer 126 may be disposed on the anode electrode 160 and may include an opening exposing the anode electrode 160. The emission area EMA and the non-emission area NEM may be divided by the pixel defining layer 126 and the opening thereof.

The light emitting layer EML is disposed on the anode electrode 160 exposed by the pixel defining layer 126. The light emitting layer EML may include an organic material layer. The organic material layer of the light emitting layer may include an organic light emitting layer, and may further include a hole injection/transport layer and/or an electron injection/transport layer.

The cathode electrode 180 may be disposed on the light emitting layer EML. The cathode electrode 180 may be a common electrode extending across all the pixels. The anode electrode 160, the light emitting layer EML, and the cathode electrode 180 may each constitute an organic light emitting element.

The cathode electrode 180 may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode 180 may further include a transparent metal oxide layer disposed on the material layer having a low work function.

The encapsulation layer ENL including a first inorganic encapsulation layer 191, an organic encapsulation layer 192, and a second inorganic encapsulation layer 193 is disposed on the cathode electrode 180. At the end of the encapsulation layer ENL, the first inorganic encapsulation layer 191 and the second inorganic encapsulation layer 193 may be in contact with each other. The organic encapsulation layer 192 may be sealed by the first inorganic encapsulation layer 191 and the second inorganic encapsulation layer 193.

Each of the first inorganic encapsulation layer 191 and the second inorganic encapsulation layer 193 may include silicon nitride, silicon oxide, silicon oxynitride, or the like. The organic encapsulation layer 192 may include an organic insulating material.

The touch layer TSL may be disposed on the encapsulation layer ENL. When the base layer 205 of the touch layer TSL is omitted, the first touch conductive layer 210 may be disposed on the encapsulation layer ENL. Since the touch layer TSL has already been described, a description thereof is omitted.

Next, a cross-sectional structure of the non-active region NAR will be described with further reference to FIG. 9.

Figure 9:
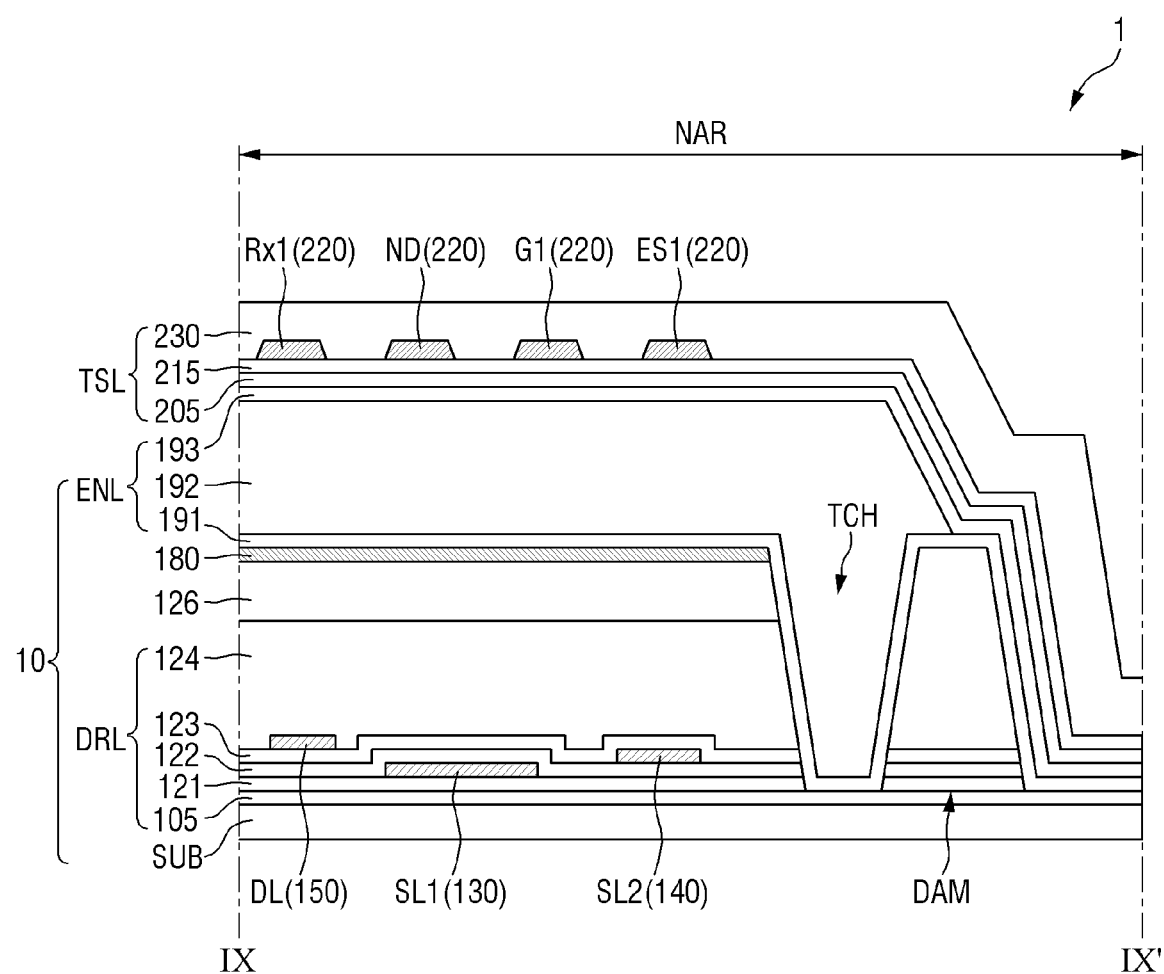
FIG. 9 is a cross-sectional view taken along line IX-IX' of FIG. 4.

FIG. 9 is a cross-sectional view taken along line IX-IX' of FIG. 4. Hereinafter, a description of the same components as those described with reference to FIG. 8 will be omitted or simplified.

Referring further to FIG. 9, the display panel 10 may further include a dam structure DAM. The dam structure DAM may be disposed in the non-active region NAR. The dam structure DAM may be disposed along the edge of the display panel 10. The dam structure DAM may include stacked insulating layers 121, 122, 123, 124, and 126. A groove TCH in which the insulating layers 121, 122, 123, 124, and 126 and the metal layers 130, 140, 150, 160 and 180 are removed except for the substrate SUB may be disposed between the dam structure DAM and the pixel. Although the drawing shows the buffer layer 105, the inventive concepts are not limited thereto, and the buffer layer 105 may be removed together with the insulating layers 121, 122, 123, 124, and 126.

At least a portion of the encapsulation layer ENL may be disposed in the groove TCH. For example, the organic encapsulation layer 192 of the encapsulation layer ENL may be disposed only to the dam structure DAM and may not be disposed beyond the dam structure DAM. That is, the organic encapsulation layer 192 may be prevented from overflowing to the outside of the display device 1, by the dam structure DAM. The first inorganic encapsulation layer 191 or the second inorganic encapsulation layer 193 of the encapsulation layer ENL may be disposed beyond the dam structure DAM.

In the non-active region NAR of the display device 1, the display panel 10 may further include a first scan driving line SL1 formed of the first gate conductive layer 130, a second scan driving line SL2 formed of the second gate conductive layer 140, and a data line DL formed of the data conductive layer 150. However, the data line DL may be omitted or may be disposed on one side or the other side of the active region AAR in the first direction DR1. In the non-active region NAR of the display device 1, the touch layer TSL may include the touch signal wire and the noise detection wire ND. FIG. 9 illustrates a first touch sensing wire Rx1, the first touch ground wire G1, and the first touch antistatic wire ES1 as an example of the touch signal wire, but the inventive concepts are not limited thereto.

The first scan driving line SL1 and the second scan driving line SL2 may be electrically connected to the driving chip 20 through a fan-out wire or the like. A scan driver connected to scan lines of the active region AAR may receive a scan timing signal from the driving chip 20 through the first scan driving line SL1 and the second scan driving line SL2. The scan driver may generate scan signals according to the scan timing signal and output the scan signals to the scan lines. The first scan driving line SL1 and the second scan driving line SL2 may extend along the first direction DR1 in the non-active region NAR disposed on the left side and/or right side of the active region AAR.

The touch signal wire and the noise detection wire ND may be formed of the same conductive layer. For example, when the touch signal wire is formed of the second touch conductive layer 220, the noise detection wire ND may also be formed of the second touch conductive layer 220. However, the conductive layer constituting the touch signal wire and the noise detection wire ND is not limited thereto.

The touch signal wire and the noise detection wire ND may be disposed above the first scan driving line SL1, the second scan driving line SL2, and the data line DL. The noise detection wire ND may overlap at least one of the first scan driving line SL1, the second scan driving line SL2, or the data line DL in the thickness direction (third direction DR3). With respect to the thickness direction (third direction DR3), the cathode electrode 180 may be disposed between the first scan driving line SL1, the second scan driving line SL2, and the data line DL and the touch signal wire and the noise detection wire ND.

The cathode electrode 180 may overlap the first scan driving line SL1, the second scan driving line SL2, and the data line DL in the thickness direction (third direction DR3), and may overlap the touch signal wire and the noise detection wire ND in the thickness direction (third direction DR3). Noise that may be received from any one of the first scan driving line SL1, the second scan driving line SL2, and the data line DL may be blocked by the cathode electrode 180. That is, when the cathode electrode 180 is disposed between the first scan driving line SL1, the second scan driving line SL2, and the data line DL and the touch signal wire, since a constant voltage of a certain magnitude is applied to the cathode electrode 180, noise that may affect a touch signal of the touch signal wire may be suppressed or prevented.

However, when the cathode electrode 180 is not disposed between the first scan driving line SL1, the second scan driving line SL2, and the data line DL and the touch signal wire, noise caused by the first scan driving line SL1, the second scan driving line SL2, and the data line DL may be generated in the touch signal wire. In addition, when the cathode electrode 180 is not disposed between the first scan driving line SL1, the second scan driving line SL2, and the data line DL and the noise detection wire ND, noise caused by the first scan driving line SL1, the second scan driving line SL2, and the data line DL may be generated in the noise detection wire ND.

Specifically, the first scan driving line SL1, the second scan driving line SL2, and the data line DL may be electrically connected to the circuit driving layer DRL to be electrically connected to the gate electrode of the thin film transistor of each pixel, thereby driving the thin film transistor, or applying a signal to the first electrode (or second electrode) of the thin film transistor of each pixel. When the thin film transistor of each pixel is turned on or off, or a signal is applied to the thin film transistor of each pixel through the first scan driving line SL1, the second scan driving line SL2, and the data line DL, the plurality of touch signal wires may be affected by voltage changes of the first scan driving line SL1, the second scan driving line SL2, and the data line DL.

For example, a signal varying with various voltages may be applied to the first scan driving line SL1, the second scan driving line SL2, and the data line DL. In this case, since an insulating layer serving as a dielectric is disposed between the first scan driving line SL1, the second scan driving line SL2, and the data line DL and the touch signal wire, a parasitic capacitance may be formed between the touch signal wire and at least one of the first scan driving line the line SL1, the second scan driving line SL2, or the data line DL. That is, the touch signal wire may be coupled to the first scan driving line SL1, the second scan driving line SL2, and the data line DL. In other words, the touch signal wire may be affected by a voltage change of at least one of the first scan driving line SL1, the second scan driving line SL2, or the data line DL, and the voltage change may be reflected in the touch signal wire, so that touch information flowing through the touch signal wire may be distorted.

However, there may be various causes of noise that may affect the touch signal wire, and thus, it may be difficult to specify the cause of the noise. Accordingly, as the display device 1 further includes the separate noise detection wire ND that is distinct from the touch signal wire, noise caused by the first scan driving line SL1, the second scan driving line SL2, and the data line DL may be detected separately.

Among the touch signal wires, the touch sensing wire Rx (see FIG. 4) is a wire that senses a touch input of the touch layer TSL, and thus may be more affected by noise. As the noise detection wire ND is arranged adjacent to the touch sensing wire Rx (see FIG. 4), noise that may affect the touch sensing wire Rx (see FIG. 4) may be more easily detected.

Further, by detecting the noise caused by the first scan driving line SL1, the second scan driving line SL2, and the data line DL, a deposition defect of the cathode electrode 180 may be detected. In addition, a non-formation defect of the cathode electrode 180 may occur from the outside of the display device 1. Accordingly, as the noise detection wire ND is arranged at the outer side of the touch sensing wire Rx (see FIG. 4), it is possible to detect even a non-formation area of the cathode electrode 180 that does not reach the lower portion of the touch sensing wire Rx (see FIG. 4).

Figure 10:
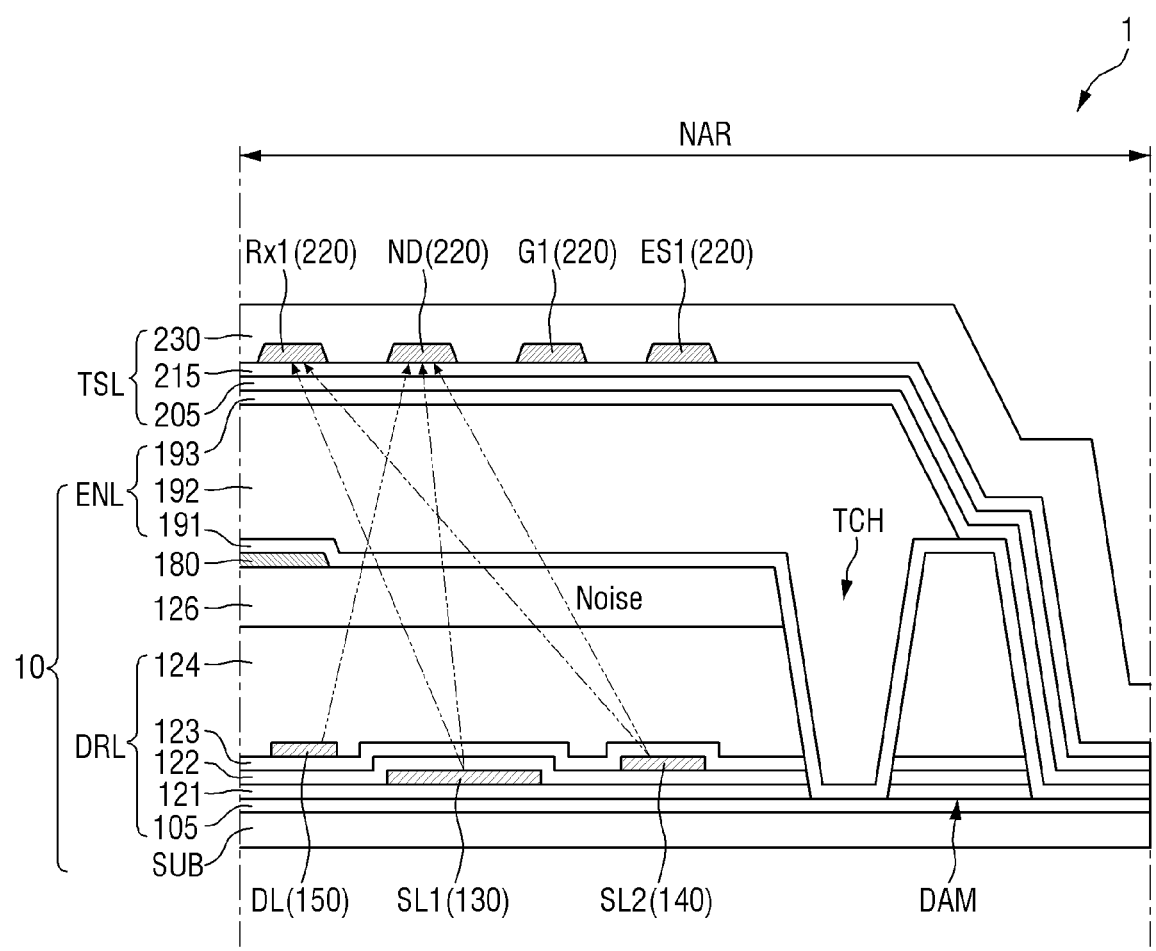
FIG. 10 is a diagram schematically illustrating a state in which noise is generated in a touch signal wire when a cathode electrode is not formed in a partial region.

FIG. 10 is a diagram schematically illustrating a state in which noise is generated in a touch signal wire when a cathode electrode is not formed in a partial region.

Referring further to FIG. 10, when the cathode electrode 180 is not deposited in a partial region, the first scan driving line SL1, the second scan driving line SL2, and the data line DL therebelow may be exposed without being covered by the cathode electrode 180 in the corresponding region. In this case, the first touch sensing wire Rx1 may be affected by a voltage change of any one of the first scan driving line SL1, the second scan driving line SL2, and the data line DL. That is, noise may be introduced into the first touch sensing wire Rx1. In addition, a voltage change of at least one of the first scan driving line SL1, the second scan driving line SL2, or the data line DL may also affect the noise detection wire ND.

Due to the noise generated by the first scan driving line SL1, the second scan driving line SL2, and the data line DL, the voltage of the noise detection wire ND may change, and this change may be sensed by the noise detection member NCM (see FIG. 4). Accordingly, the noise detection wire ND and the noise detection member NCM (see FIG. 4) may separately detect a defect of the non-formation of the cathode electrode 180 generated below the noise detection wire ND.

Hereinafter, other embodiments will be described. In the following embodiments, a description of the same components as those of the above-described embodiment will be omitted or simplified, and differences will be mainly described.

Figure 11:
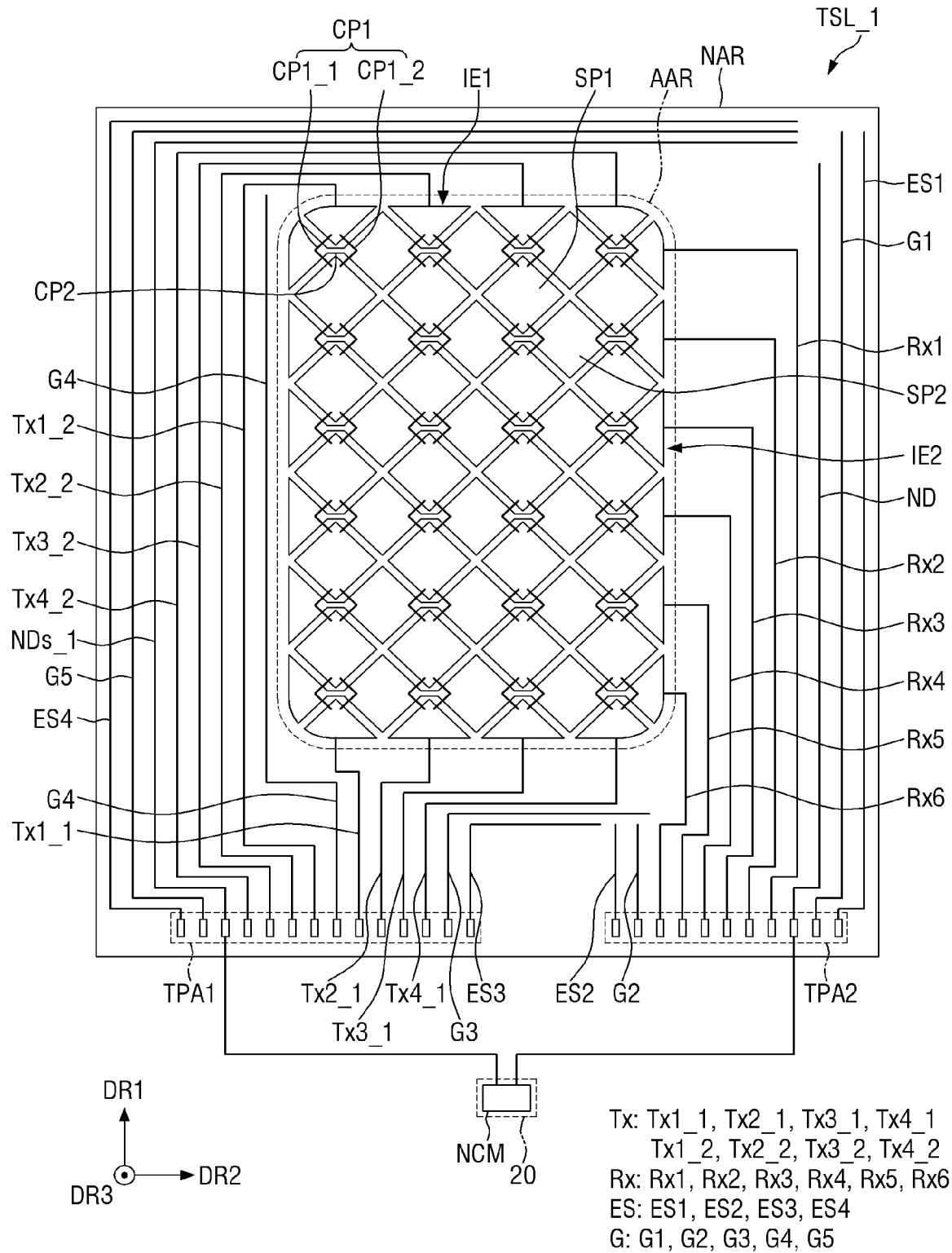
FIG. 11 is a schematic plan layout view of a touch member according to another embodiment.

FIG. 11 is a schematic plan layout view of a touch member according to another embodiment.

Referring to FIG. 11, a touch layer TSL_1 according to the present embodiment differs from that in the embodiment of FIG. 4 in that it includes a plurality of noise detection wires. Hereinafter, the above-described noise detection wire ND is referred to as a first noise detection wire ND, and the same reference numerals are used.

Specifically, the touch layer TL_1 may further include a second noise detection wire NDs_1 disposed between the touch driving wire Tx and the fifth touch ground wire G5. The second noise detection wire NDs_1 may be separated from the plurality of touch signal wires, and may be electrically insulated from the plurality of touch signal wires. That is, the second noise detection wire NDs_1 may be electrically insulated from the touch driving wire Tx, the touch ground wire G, and the touch antistatic wire ES. In addition, the second noise detection wire NDs_1 may be separated from the first sensor portion SP1 and the second sensor portion SP2, and may be electrically insulated from the first sensor portion SP1 and the second sensor portion SP2.

The first noise detection wire ND and the second noise detection wire NDs_1 may be physically separated from each other and electrically insulated from each other. The first noise detection wire ND and the second noise detection wire NDs_1 may surround the touch area and the signal wires in a ring shape. The second noise detection wire NDs_1 may extend from the touch pad portion TPA1 in the first direction DR1, and may bypass the touch area to extend in the second direction DR2. The second noise detection wire NDs_1 may be electrically connected to the noise detection member NCM through the touch pad portion TPA1.

Even in this case, a deposition defect of the cathode electrode 180 (see FIG. 9) in the outer side of the touch sensing wire Rx may be detected through the first noise detection wire ND. In addition, a deposition defect of the cathode electrode 180 (see FIG. 9) in the outer side of the touch driving wire Tx may be detected through the second noise detection wire NDs_1.

Figure 12:
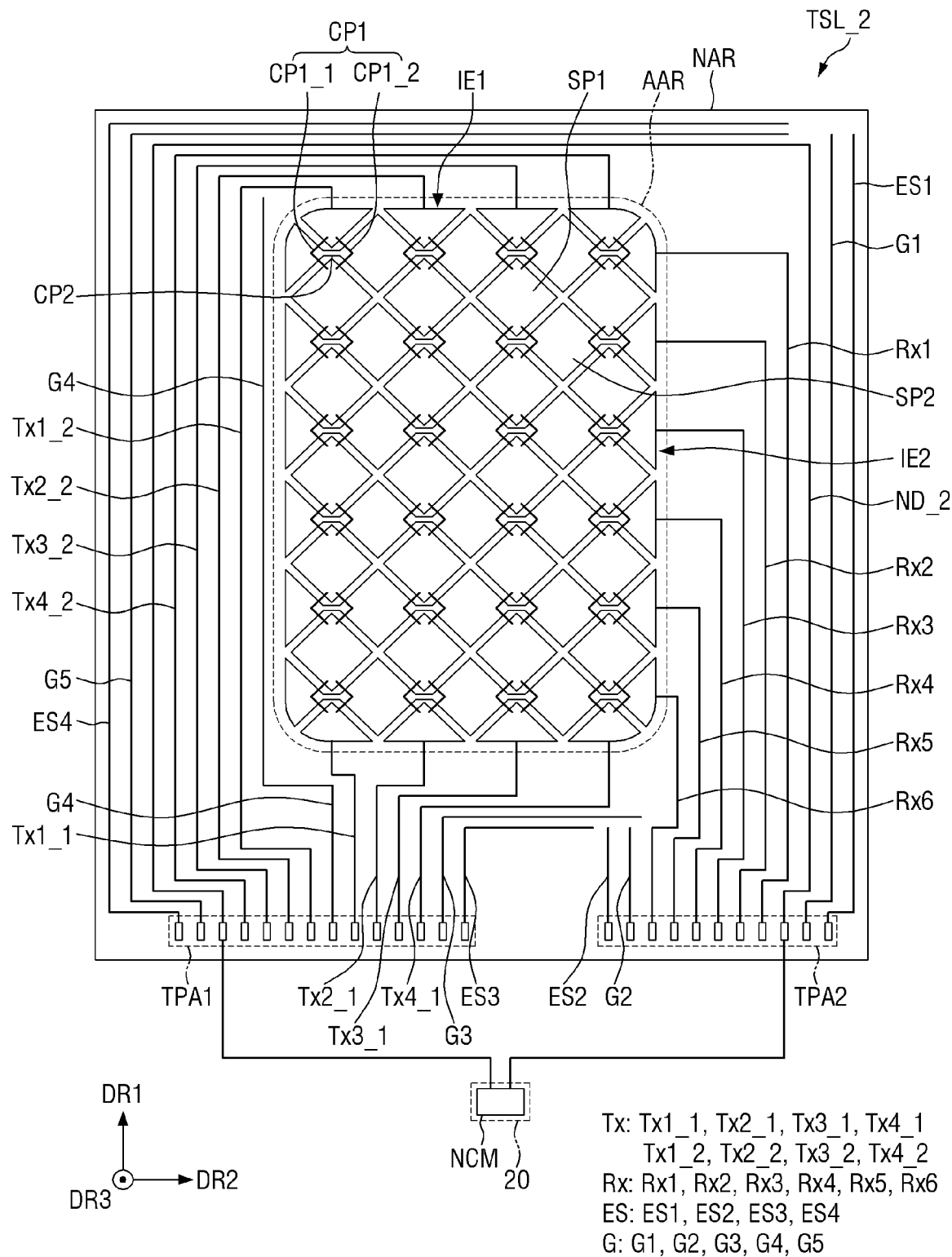
FIG. 12 is a schematic plan layout view of a touch member according to still another embodiment.

FIG. 12 is a schematic plan layout view of a touch member according to still another embodiment.

Referring to FIG. 12, a touch layer TSL_2 according to the present embodiment differs from that in the embodiment of FIG. 11 in that a noise detection wire ND_2 has a closed loop shape that bypasses the touch area. One end and the other end of the noise detection wire ND_2 may be connected to the touch pad portions TPA1 and TPA2, respectively. In this case, the noise detection wire ND_2 may be disposed between the touch sensing wire Rx and the first touch ground wire G1 and between the touch driving wire Tx and the fifth touch ground wire G5.

Even in this case, through the noise detection wire ND_2, a deposition defect of the cathode electrode 180 (see FIG. 9) in the outer side of the touch sensing wire Rx may be detected, and a deposition defect of the cathode electrode 180 (see FIG. 9) in the outer side of the touch driving wire Tx may be detected.

Figure 13:
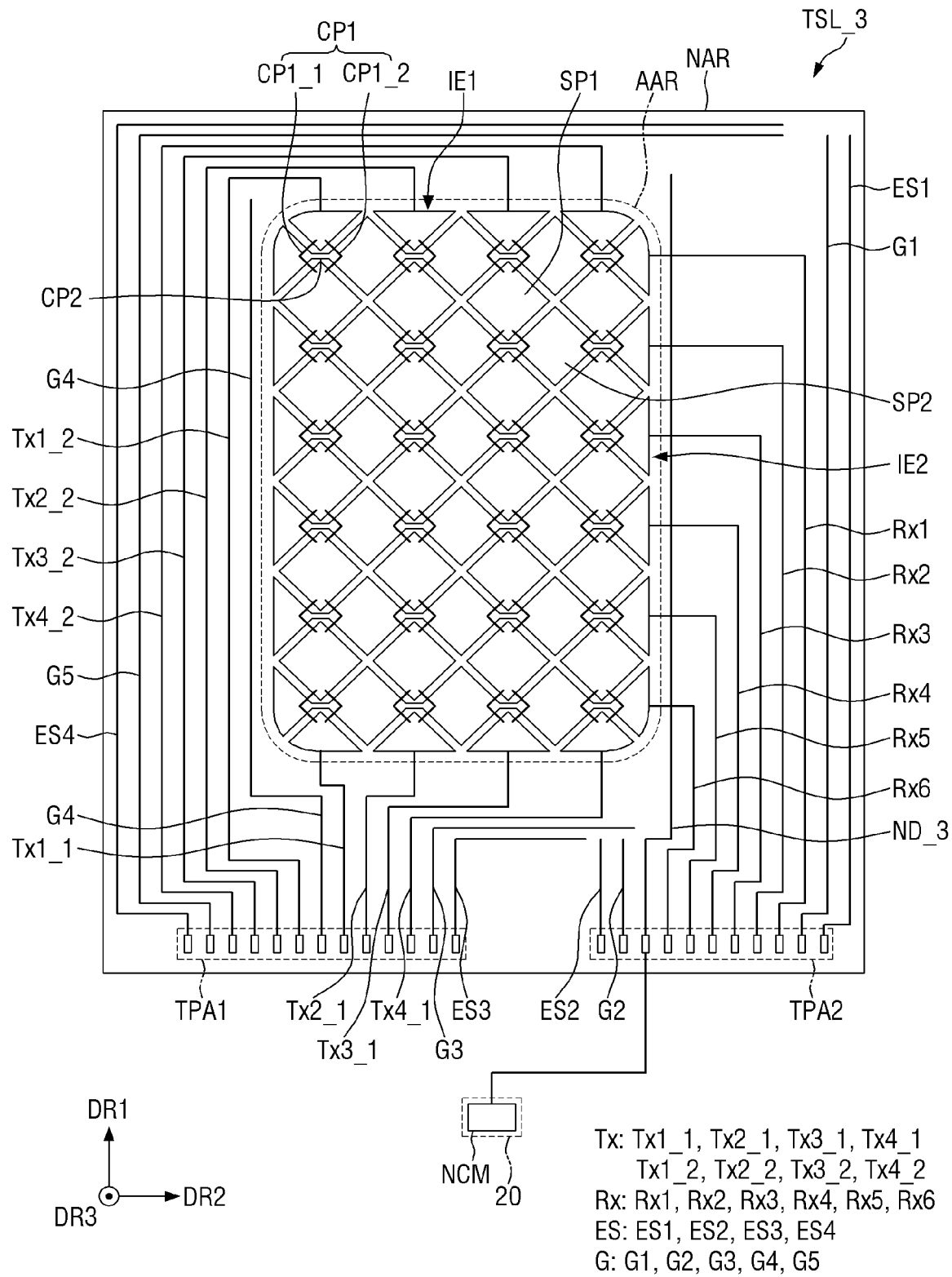
FIG. 13 is a schematic plan layout view of a touch member according to still another embodiment.

FIG. 13 is a schematic plan layout view of a touch member according to still another embodiment.

Referring to FIG. 13, a touch layer TSL_3 according to the present embodiment differs from that in the embodiment of FIG. 4 in that a noise detection wire ND_3 is arranged at the inner side of the touch sensing wire Rx. The noise detection wire ND_3 may be disposed in the non-touch area, and may be positioned to the inner side of the touch sensing wire Rx. In other words, the noise detection wire ND_3 may be disposed between the touch area and the touch sensing wire Rx.

The noise detection wire ND_3 and the touch sensing wire Rx may at least partially cross each other. When the noise detection wire ND_3 and the touch sensing wire Rx are formed of the second touch conductive layer 220 (see FIG. 9), in a region where the noise detection wire ND_3 and the touch sensing wire Rx cross each other, the noise detection wire ND_3 may bypass the touch sensing wire Rx through the first touch conductive layer 220 (see FIG. 6), and accordingly, the noise detection wire ND_3 may be insulated from the touch sensing wire Rx.

Even in this case, a deposition defect of the cathode electrode 180 (see FIG. 9) in the inner side of the touch sensing wire Rx may be detected through the noise detection wire ND_3. In addition, a deposition defect of the cathode electrode 180 (see FIG. 9) may occur from the outside of the display device, and as the noise detection wire ND_3 detects a deposition defect in the inner side of the touch sensing wire Rx, whether or not the noise affects the touch sensing wire Rx may be detected together.

Figure 14:
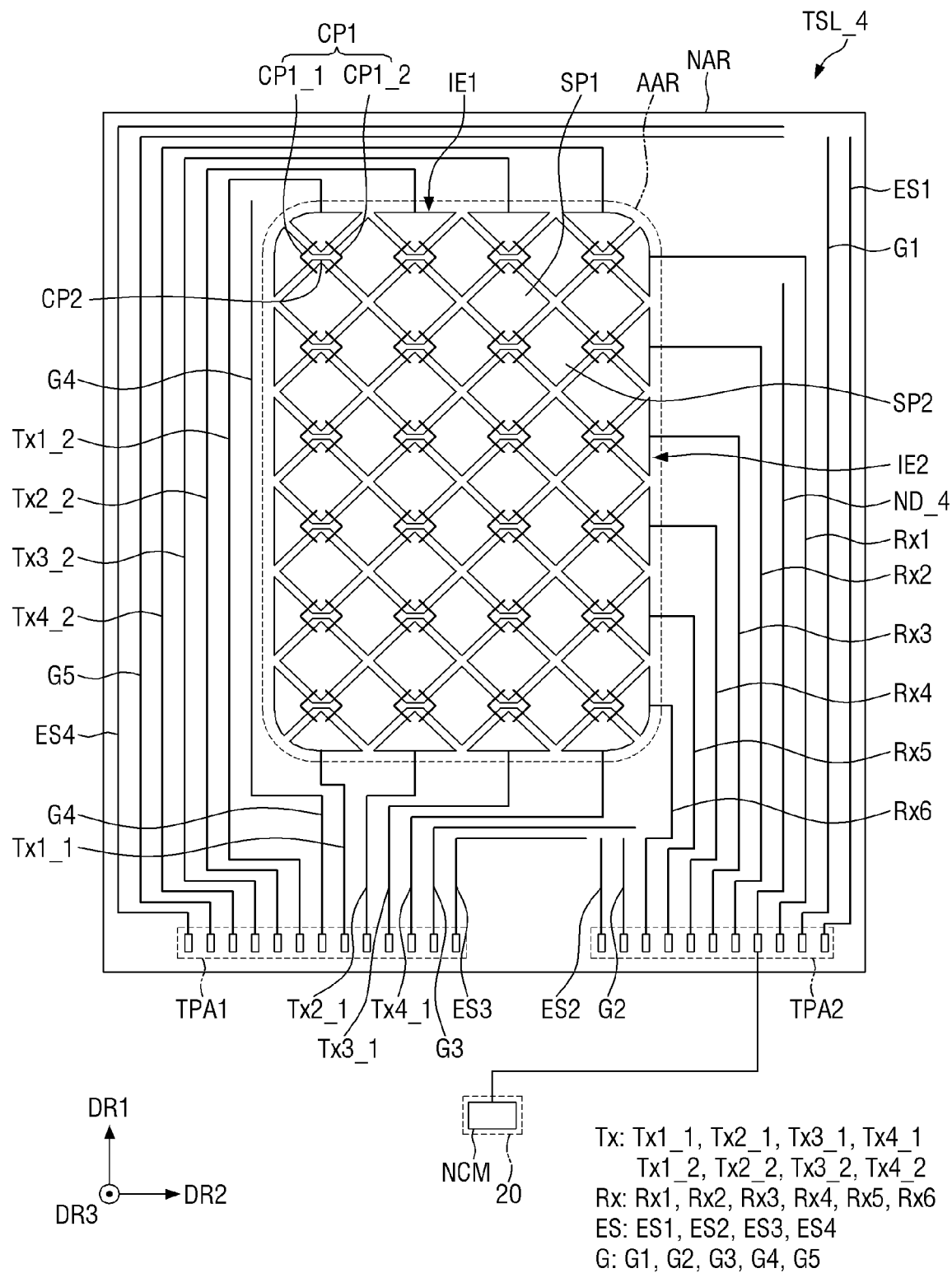
FIG. 14 is a schematic plan layout view of a touch member according to still another embodiment.

FIG. 14 is a schematic plan layout view of a touch member according to still another embodiment.

Referring to FIG. 14, a touch layer TSL_4 according to the present embodiment differs from that in the embodiment of FIG. 4 in that a noise detection wire ND_4 may be disposed between the plurality of touch sensing wires Rx. For example, the noise detection wire ND_4 may be disposed between the first touch sensing wire Rx1 and the second touch sensing wire Rx2. However, inventive concepts are not limited thereto.

Even in this case, a deposition defect of the cathode electrode 180 (see FIG. 9) in the inner side of the touch sensing wire Rx may be detected through the noise detection wire ND_4. In addition, various arrangements of the noise detection wire ND_4 are possible, if necessary.

Figure 15:
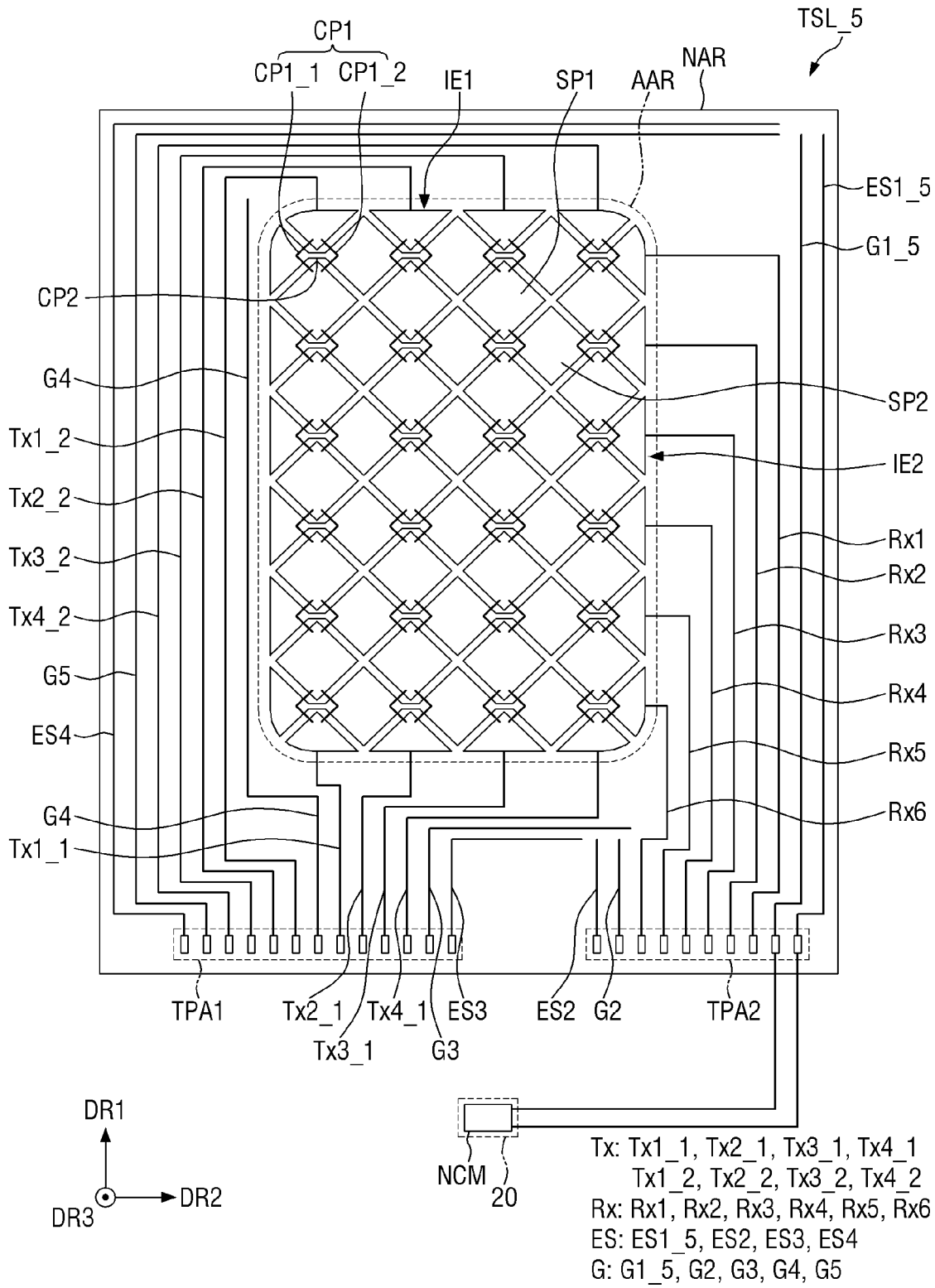
FIG. 15 is a schematic plan layout view of a touch member according to still another embodiment.

FIG. 15 is a schematic plan layout view of a touch member according to still another embodiment.

Referring to FIG. 15, a touch layer TSL_5 according to the present embodiment differs from that in the embodiment of FIG. 4 in that the touch ground wire G or the touch antistatic wire ES may serve as the noise detection wire ND (see FIG. 4). In this case, at least one of a first touch ground wire G1_5 or a first touch antistatic wire ES1_5 may be electrically connected to the noise detection member NCM.

Even in this case, a deposition defect of the cathode electrode 180 (see FIG. 9) in the inner side of the touch sensing wire Rx may be detected through at least one of the first touch ground wire G1_5 or the first touch antistatic wire ES1_5. In addition, since the separate noise detection wire ND (see FIG. 4) is unnecessary, the non-active region NAR may be reduced.

Figure 16:
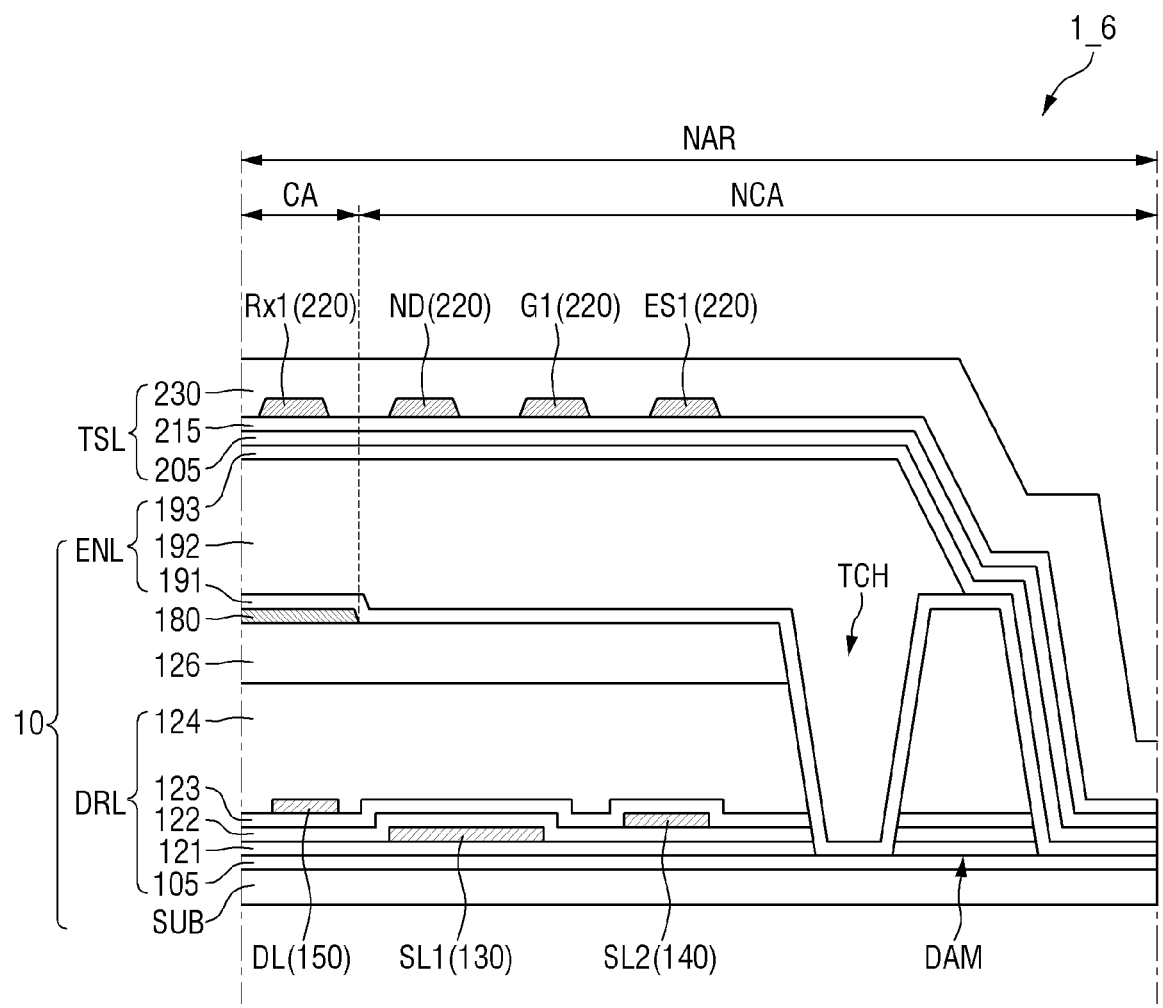
FIG. 16 is a cross-sectional view of a display device according to still another embodiment.

FIG. 16 is a cross-sectional view of a display device according to still another embodiment. FIG. 16 illustrates a cross-section of the non-active region NAR of a display device 1_6.

Referring to FIG. 16, the display device 1_6 according to the present embodiment differs from that in the embodiment of FIG. 9 in that it further includes a film formation area CA in which the cathode electrode 180 is provided and a non-film formation area NCA in which the cathode electrode 180 is not provided. In this case, the first touch sensing wire Rx1 may be disposed in the film formation area CA, and the noise detection wire ND, the first touch ground wire G1, and the first touch antistatic wire ES1 may be disposed in the non-film formation area NCA.

When noise detected by the noise detection wire ND hardly affects the touch sensing wire Rx (see FIG. 4) or insignificantly affects the touch sensing wire Rx (see FIG. 4), even if the noise detection wire ND is disposed in the non-film formation area NCA, this may be maintained. Accordingly, the noise detection wire ND may be disposed in the non-film formation area NCA.

Even in this case, a deposition defect of the cathode electrode 180 in the outer side of the touch sensing wire Rx (see FIG. 4) may be detected through the noise detection wire ND. In addition, when noise detected by the noise detection wire ND is insignificant, the noise may be measured to maintain the cathode electrode 180, and thus there may be no need to remove defects, thereby suppressing an increase in the cost of the fabricating process.

Figure 17:
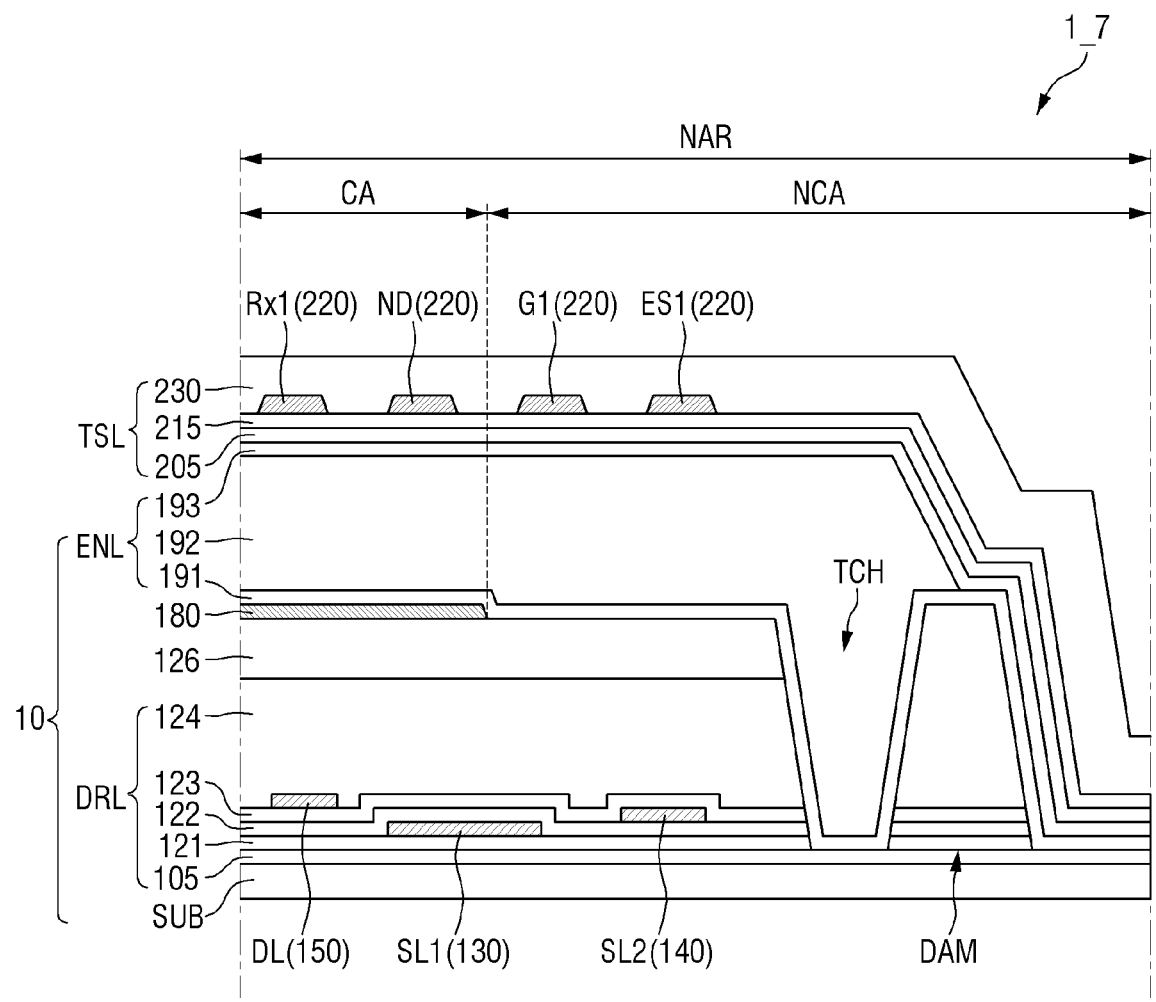
FIG. 17 is a cross-sectional view of a display device according to still another embodiment.

FIG. 17 is a cross-sectional view of a display device according to still another embodiment. FIG. 17 illustrates a cross-section of the non-active region NAR of a display device 1_7.

Referring to FIG. 17, the display device 1_7 according to the present embodiment differs from that in the embodiment of FIG. 16 in that the noise detection wire ND is disposed in the film formation area CA. In other words, the first touch sensing wire Rx1 and the noise detection wire ND may be disposed in the film formation area CA, and the first touch ground wire G1 and the first touch antistatic wire ES1 may be disposed in the non-film formation area NCA. In this case, the noise detection wire ND may overlap the cathode electrode 180 in the thickness direction (third direction DR3), and the first touch ground wire G1 and the first touch antistatic wire ES1 may not overlap the cathode electrode 180 in the thickness direction (third direction DR3).

In this case, even if the first touch ground wire G1 and the first touch antistatic wire ES1 do not overlap the cathode electrode 180 in the thickness direction (third direction DR3), since the noise detection wire ND overlaps the cathode electrode 180 in the thickness direction (third direction DR3), noise may not be detected. Even though the cathode electrode 180 is not formed in a partial region, if the touch sensing wire Rx (see FIG. 4) is not affected by noise, this may be maintained. Accordingly, there may be no need to remove the deposition defect of the cathode electrode 180, thereby suppressing an increase in the cost of the fabricating process.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel; and
a touch member disposed on the display panel,
wherein:
the touch member includes:
   a first sensing electrode extending in a first direction;
   a second sensing electrode extending in a second direction crossing the first direction;
   a first touch signal wire electrically connected to the first sensing electrode;
   a second touch signal wire electrically connected to the second sensing electrode;
   a first noise detection wire electrically insulated from the first sensing electrode, the second sensing electrode, the first touch signal wire, and the second touch signal wire; and
   a second noise detection wire arranged at an outer side of the first touch signal wire; and
the first noise detection wire and the second noise detection wire are electrically insulated from each other.

2. The display device of claim 1, wherein the first noise detection wire is arranged at an outer side of the second touch signal wire.

3. The display device of claim 2, further comprising a touch ground wire arranged at an outer side of the second touch signal wire,
- wherein the first noise detection wire is arranged between the second touch signal wire and the touch ground wire.

4. The display device of claim 2, further comprising a touch antistatic wire arranged at an outer side of the second touch signal wire,
- wherein the first noise detection wire is arranged between the second touch signal wire and the touch antistatic wire.

5. The display device of claim 2, wherein the first sensing electrode is a driving electrode, the second sensing electrode is a sensing electrode, the first touch signal wire is a touch driving wire, and the second touch signal wire is a touch sensing wire.

6. The display device of claim 1, further comprising a touch area where a touch input is detected and a non-touch area disposed around the touch area,
- wherein the first sensing electrode and the second sensing electrode are disposed in the touch area, and the first touch signal wire, the second touch signal wire, and the first noise detection wire are disposed in the non-touch area.

7. The display device of claim 1, further comprising a touch pad portion connected to the first noise detection wire, and a noise detection member connected to the touch pad portion.

8. The display device of claim 7, further comprising a driving chip including the noise detection member.

9. The display device of claim 1, wherein the first noise detection wire is formed of the same conductive layer as at least one of the first touch signal wire or the second touch signal wire.

10. The display device of claim 1, wherein the first noise detection wire has a closed loop shape, and the first touch signal wire and the second touch signal wire are arranged at an inner side of the first noise detection wire.

11. The display device of claim 10, further comprising a touch area where a touch input is detected and a non-touch area disposed around the touch area,
- wherein:
  - the first touch signal wire, the second touch signal wire, and the first noise detection wire are disposed in the non-touch area; and
  - the first noise detection wire extends to bypass the touch area.

12. A display device comprising:
- a substrate;
- an anode electrode disposed on the substrate;
- a pixel defining layer disposed on the anode electrode to expose the anode electrode;
- a light emitting layer disposed on the anode electrode exposed by the pixel defining layer;
- a cathode electrode disposed on the light emitting layer and the pixel defining layer;
- an encapsulation layer disposed on the cathode electrode;
- a touch conductive layer disposed on the encapsulation layer and including a first touch signal wire, a second touch signal wire, and a noise detection wire electrically insulated from the first touch signal wire and the second touch signal wire; and
- a touch ground wire arranged at an outer side of the second touch signal wire with the noise detection wire interposed therebetween.

13. The display device of claim 12, wherein:
- the touch conductive layer further includes a first sensing electrode extending in a first direction and electrically connected to the first touch signal wire, and a second sensing electrode extending in a second direction crossing the first direction and electrically connected to the second touch signal wire; and
- the noise detection wire is electrically insulated from the first sensing electrode and the second sensing electrode.

14. The display device of claim 13, wherein the first sensing electrode is a driving electrode, the second sensing electrode is a sensing electrode, the first touch signal wire is a touch driving wire, and the second touch signal wire is a touch sensing wire.

15. The display device of claim 14, wherein the noise detection wire is arranged at an outer side of the second touch signal wire.

16. The display device of claim 13, further comprising a touch area where a touch input is detected and a non-touch area disposed around the touch area,
- wherein the first sensing electrode and the second sensing electrode are disposed in the touch area, and the first touch signal wire, the second touch signal wire, and the first noise detection wire are disposed in the non-touch area.

17. The display device of claim 12, further comprising a touch pad portion connected to the noise detection wire, and a noise detection member connected to the touch pad portion.

18. A display device including an active region capable of displaying a screen and detecting a touch input and a non-active region disposed outside the active region, the display device comprising:
- a display panel including a scan driving line disposed in the non-active region; and
- a touch member including a first touch signal wire, a second touch signal wire, and a noise detection wire electrically insulated from the first touch signal wire and the second touch signal wire, disposed in the non-active region disposed on the display panel,
- wherein:
  - the touch member includes a touch ground wire arranged at an outer side of the second touch signal wire with the noise detection wire interposed therebetween; and
  - the noise detection wire overlaps the scan driving line.

* * * * *